United States Patent
Ugajin et al.

(10) Patent No.: US 7,061,007 B1
(45) Date of Patent: Jun. 13, 2006

(54) FERROMAGNETIC FRACTAL COMBINATION STRUCTURE

(75) Inventors: Ryuichi Ugajin, Tokyo (JP); Yoshihiko Kuroki, Tokyo (JP); Masakazu Ukita, Tokyo (JP)

(73) Assignee: Sony Corporation, Tokyo (JP)

( * ) Notice: Subject to any disclaimer, the term of this patent is extended or adjusted under 35 U.S.C. 154(b) by 980 days.

(21) Appl. No.: 09/868,360

(22) PCT Filed: Oct. 17, 2000

(86) PCT No.: PCT/JP00/07182

§ 371 (c)(1),
(2), (4) Date: Jan. 3, 2002

(87) PCT Pub. No.: WO01/29841

PCT Pub. Date: Apr. 26, 2001

(51) Int. Cl.
*H01L 29/06* (2006.01)
(52) U.S. Cl. .............................. 257/14; 257/9
(58) Field of Classification Search ............... 257/14, 257/9, 3, 183.1, 23
See application file for complete search history.

(56) References Cited

U.S. PATENT DOCUMENTS 3,696,346 A * 10/1972 Zook ........................... 365/122

5,296,716 A * 3/1994 Ovshinsky et al. ............ 257/3

OTHER PUBLICATIONS

GA. Niklasson, Fractal dimension of gas evaporated Co Aggregates Physical Review letter ( Apr. 25, 1988) p. 1735-1740.*
Ugajin, R. et al., "Anderson Transition Driven By Running Fractal Dimensions In A Fractal-Shaped Structure," *Physica—A Statistical Mechanical And Its Applications*, Apr. 15, 2000, vol. 278, No. 3-4, pp. 312-326.
Ugajin, R. et al, "Growth Model Of Coupled-Fractal Networks," *American Institiute Of Physics*, Mar. 20, 2000, vol. 76, No. 12, pp. 1624-1626.

* cited by examiner

*Primary Examiner*—David Nelms
*Assistant Examiner*—Thinh T Nguyen
(74) *Attorney, Agent, or Firm*—Sonnenschein, Nath & Rosenthal LLP

(57) ABSTRACT

Phase transition is controlled by controlling fractal dimension of a fractal-coupled structure overall or locally. For a magnetic material, ferromagnetic phase transition temperature of magnetic particles arranged to have self-similarity is controlled by fractal dimension. For a half-filled electron system confined in a treelike fractal, Mott transition is controlled by fractal dimension of the system. Stronger quantum chaos than conventional ones is generated by adding magnetic impurities to the fractal-coupled structure, and through this process, Anderson transition is controlled.

3 Claims, 28 Drawing Sheets

$\alpha=2$, $n=10000$

Fig. 1

| $\alpha$ | $D_f$ |
|---|---|
| 0.0 | 2.91 |
| 0.4 | 2.79 |
| 0.8 | 2.54 |
| 1.2 | 2.25 |
| 1.6 | 2.21 |
| 2.0 | 2.16 |

| α | $D_f$ |
|---|---|
| 0.0 | 2.910 |
| 0.2 | 2.897 |
| 0.4 | 2.790 |
| 0.6 | 2.577 |
| 1.0 | 2.450 |
| 2.0 | 2.164 |

FERROMAGNETIC FRACTAL COMBINATION STRUCTURE

This application is a 371 of PCT/JP00/07182 Oct. 17, 2000.

BACKGROUND OF THE INVENTION

1. Field of the Invention

This invention relates to a control method of phase transition of fractal-coupled structures, fractal-coupled structures, ferromagnetic fractal-coupled structures, information processing method, information storage method, information storage medium, information processing device and information storage device, which, in particular, are based on a new principle.

2. Background Art

Materials exhibiting ferromagnetism are widely used as storage mediums, and support present technologies. Not only bulk magnetic materials but also those variously designed in layered structures are used, and they are employed in, for example, magneto-optical discs (MO discs). There are also vigorous researches and developments toward future magnetic materials, and in recent years, powder magnetic materials, i.e. magnetic particles, have been remarked ((1) J. M. L. Billas, A. Chatelain, W. A. de Heer, Science, 265, 1682(1994), (2) D. Gatteschi, A. Caneschi, L. Pardi and R. Sessoli, Science, 265, 1054(1994)).

On the other hand, inherent non-linearity is indispensable as a physical system assuming information processing. Although linearly responsive ones are also used as devices, they cannot be active devices. As devices used conventionally, there are electronic devices using materials that exhibit non-linear responses to a certain extent. For example, two-terminal devices exhibiting differential negative resistance are an example of those having non-linearity in current-voltage characteristics. Of course, three-terminal MOS-FETs also support the present techniques. Then, by coupling these electronic devices having non-linearity with linear electronic circuits and thereby building an information processing apparatus having non-linearity, any desired calculation can be performed.

However, difficulties by high integration have become issues with such electronic circuits. Heating is one of such problems. Heating caused by inherent electric resistance is indispensable for creating non-linearity of an electronic device, indispensable for executing information processing, and therefore essential.

In order to overcome the difficulty, trials have been made to decrease devices by enhancing non-linearity of components elements. Progress of this scheme necessarily leads to the demand for component devices having as strong non-linearity as exhibiting a chaos. When a classical system exhibiting a chaos is quantized, what characterizes the behaviors of the quantum system is a quantum chaos.

On the other hand, as a component device is minimized more and more, electrons confined in the device will behave as quantum-mechanic particles. Therefore, from this viewpoint, hopes are placed on component devices exhibiting a chaos.

For application of a solid material to electronic or optical devices, physical properties of the material may restrict its applications. For example, in case of using a semiconductor material in a light emitting device, it will be usable in a device of an emission wavelength corresponding to the band gap of the material, but some consideration will be necessary for changing the emission wavelength. Regarding physical properties related to semiconductor bands, controls by superlattices have been realized. More specifically, by changing the period of a superlattice, the band width of its subband can be controlled to design an emission wavelength.

Targeting on controlling many-electron-state structures by material designs, the Inventors proposed many-body effect engineering by quantum dot coupled structures and has continued theoretical analyses ((3) U.S. Pat. No. 5,430, 309; (4) U.S. Pat. No. 5,663,571; (5) U.S. Pat. No. 5,719, 407; (6) U.S. Pat. No. 5,828,090; (7) U.S. Pat. No. 5,831, 294; (8) J. Appl. Phys. 76, 2833(1994); (9) Phys. Rev. B51, 10714(1995); (10) Phys. Rev. B51, 11136(1995); (11) J. Appl. Phys. 77, 5509(1995); (12) Phys. Rev. B53, 6963 (1996); (13) Phys. Rev. B53, 10141(1996); (14) Appl. Phys. Lett. 68, 2657(1996); (15) J. Appl. Phys. 80, 3893(1996); (16) J. Phys. Soc. Jpn. 65, 3952(1996); (17) Jpn. J. Appl. Phys. 36, 638(1997); (18) J. Phys. Soc. Jpn. 66, 425(1997); (19) Jpn. J. Appl. Phys. 81, 2693(1997); (20) Physica (Amsterdam) 229B, 146(1997); (21) Physica (Amsterdam) 237A, 220(1997); (22) Surf. Sci. 375, 403(1997); (23) Physica (Amsterdam) 240B, 116(1997); (24) Physica (Amsterdam) 240B, 128(1997); (25) Physica (Amsterdam) 1E, 226(1997); (26) Phys. Rev. Lett. 80, 572(1998); (27) Jpn. J. Appl. Phys. 37, 863(1998); (28) Physica (Amsterdam) 245B, 311(1998); (29) Physica (Amsterdam) 235B, 96(1998); (30) Phys. Rev. B59, 4952(1999); (31) Surf. Sci. 432, 1(1999); (32) International Journal of Modern Physics B. Vol. 13, No. 21, 22, pp. 2689–2703, 1999). For example, realization of various correlated electronic systems is expected by adjusting a tunneling phenomenon between quantum dots and interaction between electrons. Let the tunneling transfer between adjacent quantum dots be written as t. Then, if quantum dots are aligned in form of a square lattice, the bandwidth of one electron state is $T_{eff}=4t$. If quantum dots form a one-dimensional chain, the band width of one electron state is $T_{eff}=2t$. In case of a three-dimensional quantum dot array, $T_{eff}=6t$. That is, if D is the dimension of a quantum dot array, the band width of one electron state has been $T_{eff}=2Dt$.

When a magnetic material is used in a storage medium, it may be necessary to heat it high above the temperature of its ferromagnetic phase transition for, for example, erasure of storage, and this is a constraint on its applications. Therefore, if the ferromagnetic phase transition temperature can be controlled by changing some parameter without heating, the possibility of various technical applications will be extended.

On the other hand, regarding devices using a quantum chaos, it is known that degeneracy in density of states occurs due to the self-similarity in a quantum system having a fractal structure. Although this itself is useful, the quantum chaos the system exhibits is defined by GOE (Gaussian orthogonal ensemble) distribution, it is relatively weak in terms of quantum chaos. Thus there is a demand for realization of a stronger quantum chaos.

Further, consideration is made about half-filled (one electron per each quantum dot) Mott transition (also called Mott-Hubbard transition or Mott metal-insulator transition). Let the effective electrons interaction within a quantum dot be written as $U_{eff}$, then the Hubbard gap on the part of the Mott insulator is substantially described as $\Delta=U_{eff}-T_{eff}$, and the Mott transition can be controlled by changing $U_{eff}$ or t. As already proposed, the Mott-Hubbard transition can be controlled by adjusting $U_{eff}$ or t, using a field effect, it is applicable to field effect devices (References (7), (8), (13) and (16) introduced above). However, if the Mott-Hubbard transition can be controlled by controlling a parameter other than the field effect, it is more advantageous for increasing the possibility of its applications.

It is therefore an object of the invention to provide a method of controlling phase transition of a fractal-coupled structure, which can control phase transition such as ferromagnetic phase transition without the need for heating, unlike the conventional techniques.

Another object of the invention is to provide a fractal-coupled structure and a ferromagnetic fractal-coupled structure in which the above-indicated control method can be used.

A further object of the invention is to provide an information processing method, information storage method, information storage medium, information processing device and information storage device that use the above-mentioned control method or fractal-coupled structure.

SUMMARY OF THE INVENTION

The Inventors found, through concentrated researches toward solution of those issues, that in a system using a fractal-coupled structure the fractal dimension is closely related to occurrence of phase transition, and the phase transition can be controlled by controlling the fractal dimension. The phase transition includes various kinds of transition, such as ferromagnetic phase transition, Mott-Hubbard transition, Anderson transition via generation of a quantum chaos, and so forth. The phase transition can be used in information storage, and more generally in information processing, by the phase state before phase transition to information.

The present invention has been made as a result of further researches from various other viewpoints based on the former researched by the Inventor.

According to the first aspect of the invention, there is provided a method for controlling phase transition of a fractal-coupled structure characterized in controlling phase transition by controlling fractal dimension of a fractal-coupled structure overall or locally.

In the first aspect of the invention, if phase transition by a change in temperature is used, phase transition temperature is controlled by controlling fractal dimension of the fractal-coupled structure. Especially when the fractal-coupled structure is a ferromagnetic fractal-coupled structure, ferromagnetic phase transition temperature is controlled by controlling fractal dimension of the ferromagnetic fractal-coupled structure. In the ferromagnetic fractal-magnetic structure, a remarkable change in phase transition temperature can be obtained when the fractal dimension is not smaller than 2.5.

Alternatively, generation of quantum chaos in the fractal-coupled structure may be controlled by controlling the fractal dimension of the fractal-coupled structure, and through it, Anderson (local) transition may be controlled. This is applicable to a fractal-coupled structure to which a magnetic impurity is added.

Phase transition may be metal-insulator transition, which is suitable for a fractal-coupled structure controlled to have a half-filled electron density. Usable as this type of fractal-coupled structure is one composed of a quantum dot array, made of, for example, heterojunction of compound semiconductors.

According to the second aspect of the invention, there is provided a ferromagnetic fractal-coupled structure characterized in comprising a magnetic material configured to have self-similarity.

In the second aspect of the invention, ferromagnetic phase transition temperature is typically determined by selecting a fractal dimension that characterizes self-similarity of a magnetic material. Especially for obtaining a drastic change in phase transition temperature, fractal dimension of the magnetic material is adjusted to not smaller than 2.5. The magnetic material takes the form of, for example, magnetic particles or magnetic atoms. The features explained above with reference to the first aspect of the invention may be applied here again unless they are incompatible.

According to the third aspect of the invention, there is provided a fractal-coupled structure characterized in being configured to have self-similarity and being applied with random magnetic fields.

In the third aspect of the invention, random fields are typically applied by addition of magnetic impurities in its component material. The random magnetic fields are introduced to allow both realization of stronger quantum chaos by the effect of the magnetic fields and self-similarity the fractal configuration has. In the fractal-coupled structure added with the magnetic impurity, self-similar strong-coupled quantum chaos can be realized.

According to the fourth aspect of the invention, there is provided a fractal-coupled structure characterized in being configured to have self-similarity and having a half-filled electron density.

In the fourth aspect of the invention, interaction of electrons typically in an electron system can be made larger than the band width, and Mott metal-insulator transition exists, which is controlled by fractal dimension of the system. This fractal-coupled structure can be composed of a quantum dot array made of, for example, heterojunction of compound semiconductors. This type of fractal-coupled structure can be used to construct, for example, a semiconductor device or an electronic device.

According to the fifth aspect of the invention, there is provided an information processing method characterized in executing information processing by controlling phase transition through overall or local control of fractal dimension of a fractal-coupled structure.

According to the sixth aspect of the invention, there is provided an information storage method characterized in performing information storage by controlling phase transition through overall or local control of fractal dimension of a fractal-coupled structure.

According to the seventh aspect of the invention, there is provided an information storage medium using a ferromagnetic fractal-coupled structure made of a magnetic material configured to have self-similarity.

According to the eighth aspect of the invention, there is provided an information storage medium using a fractal-coupled structure configured to have self-similarity and applied with random magnetic fields.

In the eighth aspect of the invention, information can be stored by using coexistence of degeneracy of density of states caused by the self-similarity and a strong quantum chaotic state, which appear in the fractal-coupled structure.

According to the ninth aspect of the invention, there is provided an information storage medium characterized in using a fractal-coupled structure which is configured to have self-similarity and has a half-filled electron density.

According to the tenth aspect of the invention, there is provided an information processing device characterized in executing information processing by controlling phase transition through overall or local control of fractal dimension of a fractal-coupled structure.

According to the eleventh aspect of the invention, there is provided an information processing device characterized in:

using a ferromagnetic fractal-coupled structure made of a magnetic material configured to have self-similarity; and executing information processing by controlling phase transition through overall or local control of fractal dimension of the fractal-coupled structure.

According to the twelfth aspect of the invention, there is provided an information processing device characterized in:

using a fractal-coupled structure configured to have self-similarity and applied with random magnetic fields; and executing information processing by controlling phase transition through overall or local control of fractal dimension of the fractal-coupled structure.

According to the thirteenth aspect of the invention, there is provided an information processing device characterized in:

using a fractal-coupled structure configured to have self-similarity and having a half-filled electron state; and executing information processing by controlling phase transition through overall or local control of fractal dimension of the fractal-coupled structure.

According to the fourteenth aspect of the invention, there is provided an information storage device characterized in executing information storage by controlling phase transition through overall or local control of fractal dimension of a fractal-coupled structure.

According to the fifteenth aspect of the invention, there is provided an information storage device characterized in:

using a ferromagnetic fractal-coupled structure made of a magnetic material configured to have self-similarity; and executing information storage by controlling phase transition through overall or local control of fractal dimension of the fractal-coupled structure.

According to the sixteenth aspect of the invention, there is provided an information storage device characterized in:

using a fractal-coupled structure configured to have self-similarity and applied with random magnetic fields; and executing information storage by controlling phase transition through overall or local control of fractal dimension of the fractal-coupled structure.

According to the seventeenth aspect of the invention, there is provided an information storage device characterized in:

using a fractal-coupled structure configured to have self-similarity and having a half-filled electron density; and executing information storage by controlling phase transition through overall or local control of fractal dimension of the fractal-coupled structure.

In the fifth to seventeenth aspects of the invention, the features explained above with reference to the first to fourth aspects of the invention may be applied unless they are incompatible.

According to the invention having any of the above-summarized constructions, phase transition of a fractal-coupled structure can be controlled by controlling fractal dimension without the need for heating that has been indispensable conventionally, and it can be used for execution of various kinds of information processing, including information storage.

BRIEF DESCRIPTION OF DRAWINGS

FIG. 1 is a schematic diagram that shows a fractal dimension Df obtained with a parameter a in a first embodiment of the invention;

FIG. 15 is a schematic diagram that shows a fractal dimension $D_f$ obtained with a parameter $\alpha$ in the second embodiment of the invention;

DETAILED DESCRIPTION OF THE PREFERRED EMBODIMENTS

Figure 2:
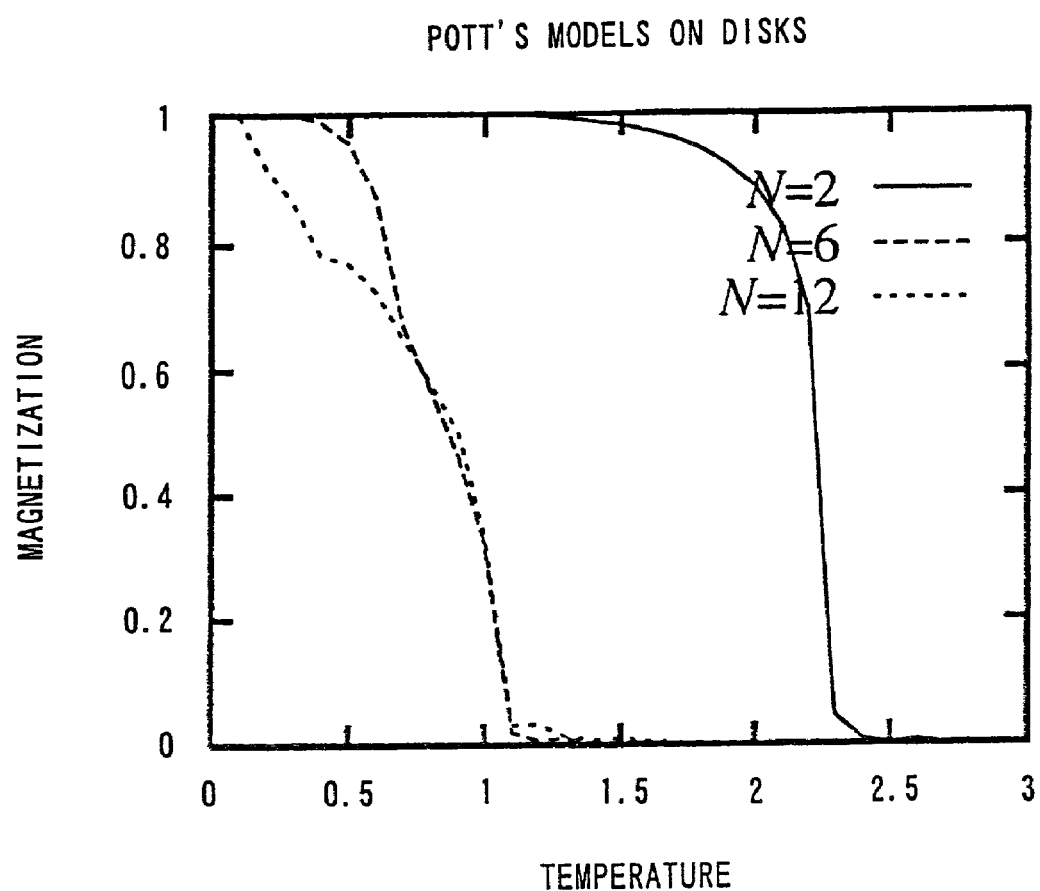
FIG. 2 is a schematic diagram that shows a relation between temperature and magnetization of a two-dimensional on-disk Pott's model in the first embodiment of the invention.

Embodiments of the invention will now be explained below.

Explanation is started with the first embodiment of the invention. In the first embodiment, explanation will be made about controls of transition temperature by fractal dimension of a ferromagnetic fractal-coupled structure.

The ferromagnetic fractal-coupled structure is made by creating a fractal in the following manner and placing a spin thereon.

(1) Formation of a Fractal

First reviewed is a dielectric breakdown model ((33) A. Erzan, L. Pietronero, A. Vespignani, Rev. Mod. Phys. 67, 545(1995); (34) L. Niemeyer, L. Pietronero, H. J. Wiesmann, Phys. Rev. Lett. 52, 1033(1984)).

Let a square lattice S in a three-dimensional space be defined, and let a scalar potential field $\phi(i_1, i_2, i_3)$ be defined on lattice sites of the square lattice $(i_1, i_2, i_3) \in S$. Let it be called a potential and let the potential obey the Laplace equation $$\Delta\phi(i_1, i_2, i_3)=0 \quad (1)$$

A pattern $T_n$ is a set of lattice sites on the three-dimensional lattice. $T_0$ contains (0, 0, 0) alone, and $T_{n+1}$ is created by adding a single lattice site to $T_n$ according to the rule give below.

Let the potential of each site contained in $T_n$ be 1 and let the potential at infinity be 0. That is, $$\phi(i_1,i_2,i_3)=0 \text{ when } (i_1,i_2,i_3)\to\infty \quad (2)$$

$$\phi(i_1,i_2,i_3)=1 \text{ when } (i_1,i_2,i_3)\in T_n \quad (3)$$

Under these boundary conditions, Equation (1) is solved to determine the potential. The lattice site which will be added to $T_n$ to construct $T_{n+1}$ is not contained in $T_n$, and it is selected from the set of lattice sites, i.e. $U_n$, nearest to $T_n$. The number of lattice sites contained in $U_n$ is denoted by $N_n$.

Strength of the electric fields for lattice sites $(i_{1,m}, i_{2,m}, i_{3,m})$ (where m=1, 2, ..., $N_n$) in $U_n$ is defined as $$E_m(\alpha)=|\phi(i_{1,m},i_{2,m}, i_{3,m})-1|^\alpha \quad (4)$$

The probability that a certain site $(i_{1,m}, i_{2,m}, i_{3,m})$ in $U_n$ is selected is proportional to the electric field $E_m(\alpha)$. That is, the probability is $$p_m(\alpha) = \frac{E_m(\alpha)}{\sum_{j=1}^{N_n} E_j(\alpha)} \quad (5)$$

By repeating these operations, construction of $T_n$ is progressed. An ideal fractal will be a set of limits repeated infinitely as $$T_\infty = \lim_{n\to\infty} T_n \quad (6)$$

When α=1, the foregoing and the result of generation of the pattern byDiffusion limitedaggregation ((35) T. A. Witten, Jr. and L. M. Sander, Phys. Rev. Lett. 47, 1400(1984); Phys. Rev. B27, 5686(1983)). Fractal dimensions $D_f$ of fractal patterns obtained by numerical simulation with various values of α are collectively shown in FIG. 1.

(2) Spin System on a Fractal

Let a spin system describing a ferromagnetic material be defined on the fractal defined in (1). Assume a lattice site shown below, which is the origin of $T_n$.

$$r_p=(i_{1,p},i_{2,p},i_{3,p})\in T_n \quad (7)$$

where p=1, 2, ..., n+1. By placing a spin on a lattice site $r_p \in T_n$, here is taken a spin system that can be described by the following Hamiltonian.

$$H = -\sum_{p,q} J_{p,q} S_p \cdot S_q \quad (8)$$

$S_p$ is the spin at the p site. As spin-spin interaction $J_{p,q}$, a natural model is:

$$J_{p,q} = \begin{cases} 1 & \text{when } |r_p - r_q| = 1 \\ 0 & \text{otherwise} \end{cases} \quad (9)$$

That is, spin-spin interaction exists only between nearest sites. For the purpose of calculating spontaneous magnetization M at a finite temperature T, statistical mechanics of an equilibrium system is introduced. A partition function Z is defined as follows.

$$Z = \sum_{\{S_p\}} e^{-H/T} \tag{10}$$

where $\{S_p\}$ in the symbol of the sum pertains to the sum regarding all spin states. Spontaneous magnetization is defined as the statistical average of spin as follows.

$$M = \frac{1}{n+1} \sum_{p=1}^{n+1} \langle S_p \rangle \tag{11}$$

where the expected value $\langle S_p \rangle$ is $$\langle S_p \rangle = \frac{1}{Z} \sum_{\{S_p\}} S_p e^{-H/T} \tag{12}$$

and n+1 is the total number of spins. N is generally a vector quantity in a spin space, but its absolute value M=|M| is calculated.

A Pott's model is taken as the first example ((36) F. Y. Wu, Rev. Mod. Phys. 54, 235(1982)). This model uses as the spin $$S_p = \left( \cos \frac{2\pi n_p}{N}, \sin \frac{2\pi n_p}{N} \right) \tag{13}$$

where $n_p$=0, 1, 2, ..., N−1. In case of N=2, it is the same as an Ising model, and simulation is executed regarding N=2, N=6 and N=12. As a second example, those taking spin states at vertices of regular octahedrons and regular icosahedrons are taken for consideration. For these spin systems, spontaneous magnetization is calculated by using the Monte Carlo method. In the following example, 10000 Monte Carlo steps were used. As fractals, those by 10000 steps of growth under each value of α, that is, fractals of n=10001, were used.

Figure 3:
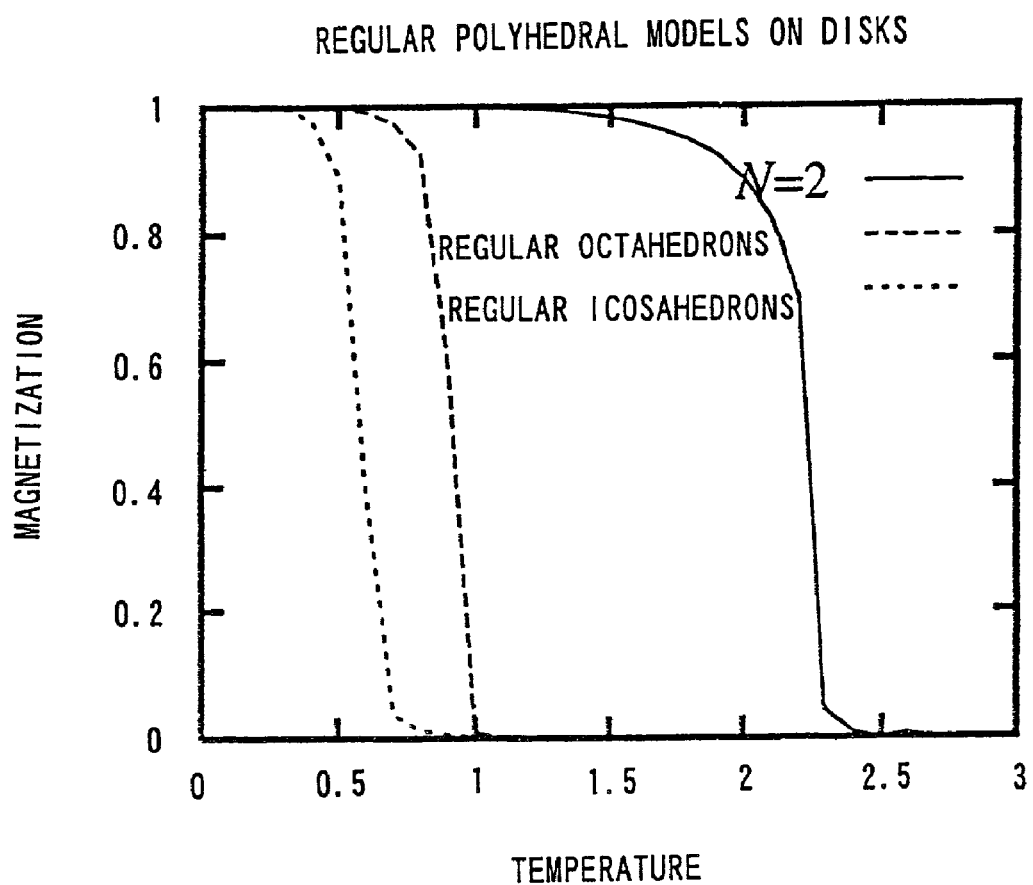
FIG. 3 is a schematic diagram that shows a relation between temperature and magnetization of an on-disk regular polyhedral model in the first embodiment of the invention.

Prior to showing results about magnetism on fractals, here are shown results of calculation of spontaneous magnetization of normal two-dimensional and three-dimensional systems. As two-dimensional systems, those having 10001 sites in a disk-like arrangement were used. FIG. 2 shows the results of two-dimensional on-disk Pott's models. In case of an Ising model of N=2, transition temperature $T_c$ is ~2.3. On the other hand, in models of N=6 and N=12, $T_c$ is ~1.2. FIG. 3 shows results of regular polyhedral models. For reference, results of Ising models were shown together. $T_c$ is ~1.0 in regular octahedral models, and $T_c$ is ~0.7 in icosahedral models.

Figure 4:
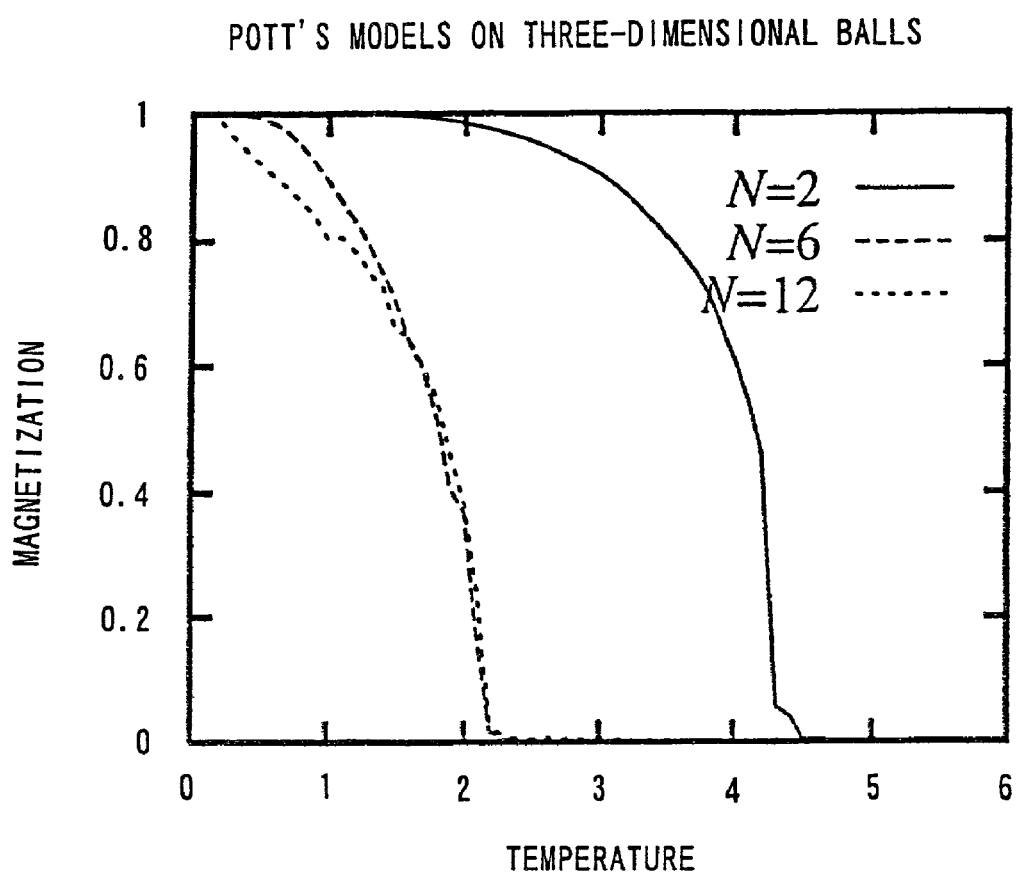
FIG. 4 is a schematic diagram that shows a relation between temperature and magnetization of a three-dimensional on-ball Pott's model in the first embodiment of the invention.
Figure 5:
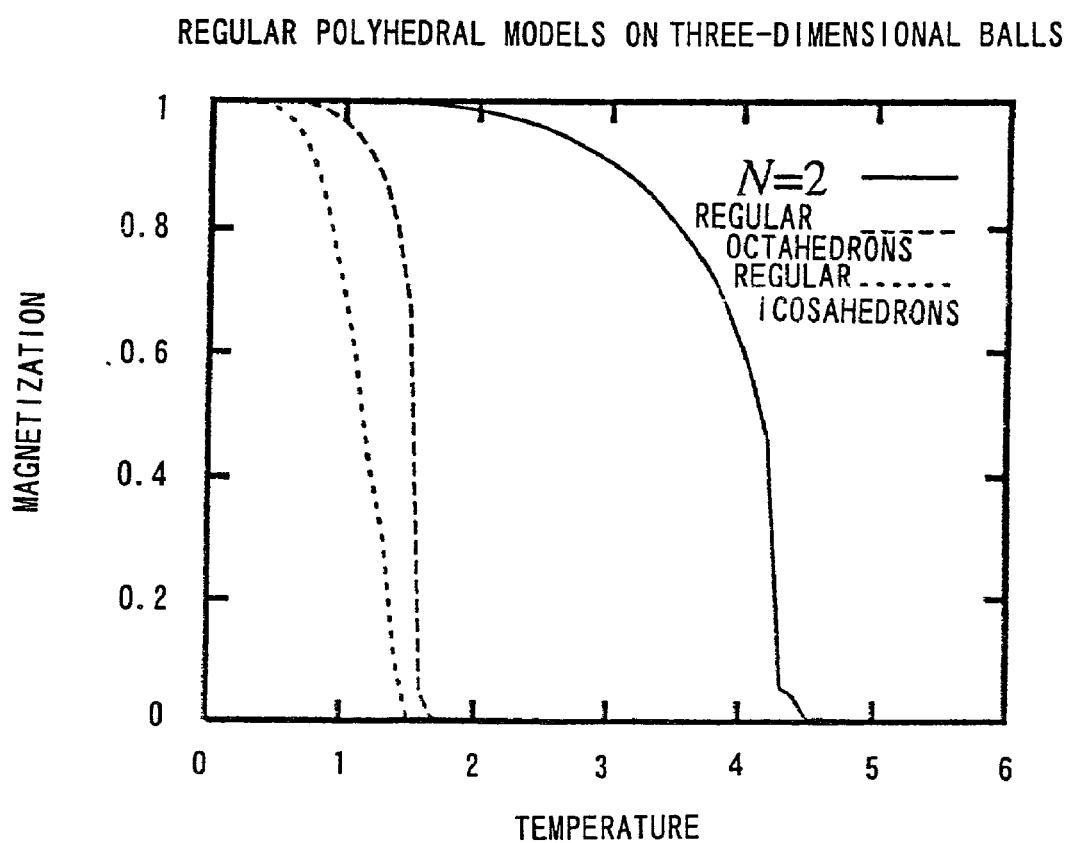
FIG. 5 is a schematic diagram that shows a relation between temperature and magnetization of a three-dimensional on-ball regular polyhedral model in the first embodiment of the invention.

The review is now developed to three-dimensional systems. In this case, models placing 10001 sites in form of balls. FIG. 4 shows results of three-dimensional on-ball Pott's models. In case of an Ising model of N=2, $T_c$ is ~4.2. In case of N=6 and N=12, $T_c$ is ~2.1. FIG. 5 shows results of regular polyhedral models. For reference, results of Ising models were shown together. $T_c$ is ~1.6 In regular octahedral models, and $T_c$ is ~1.5 in regular icosahedral models.

Figure 6:
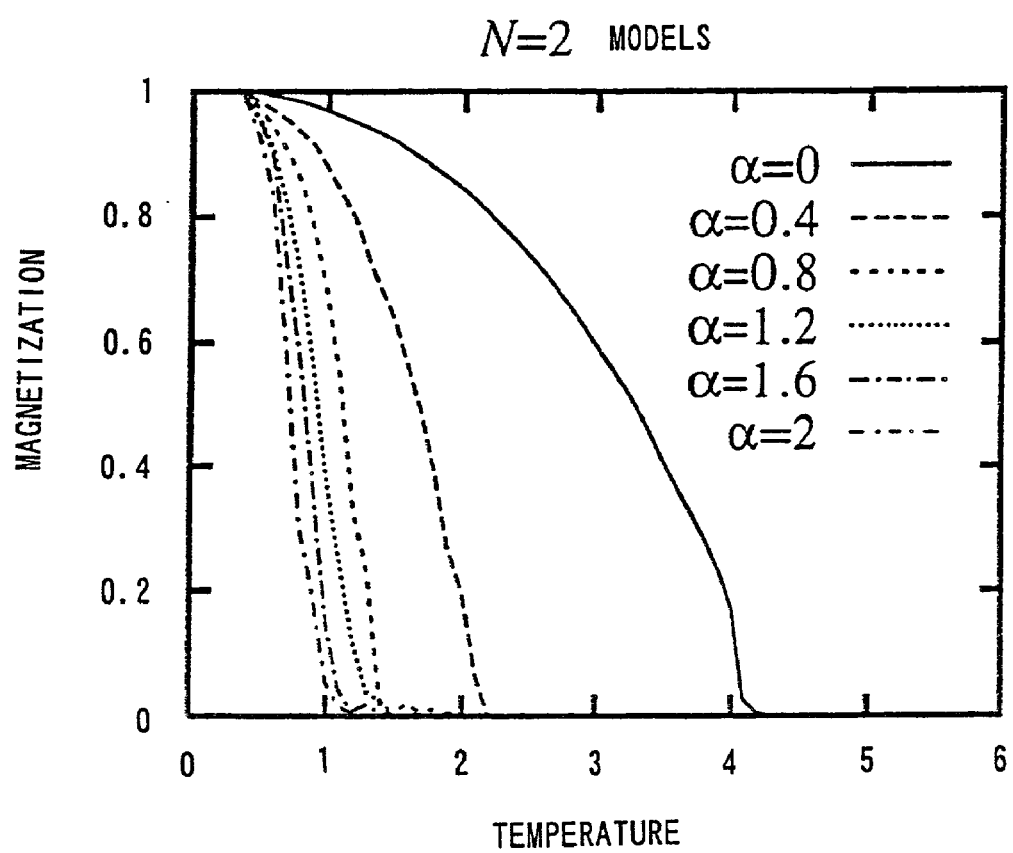
FIG. 6 is a schematic diagram that shows a relation between temperature and magnetization of an N=2 Ising model in the first embodiment of the invention.
Figure 7:
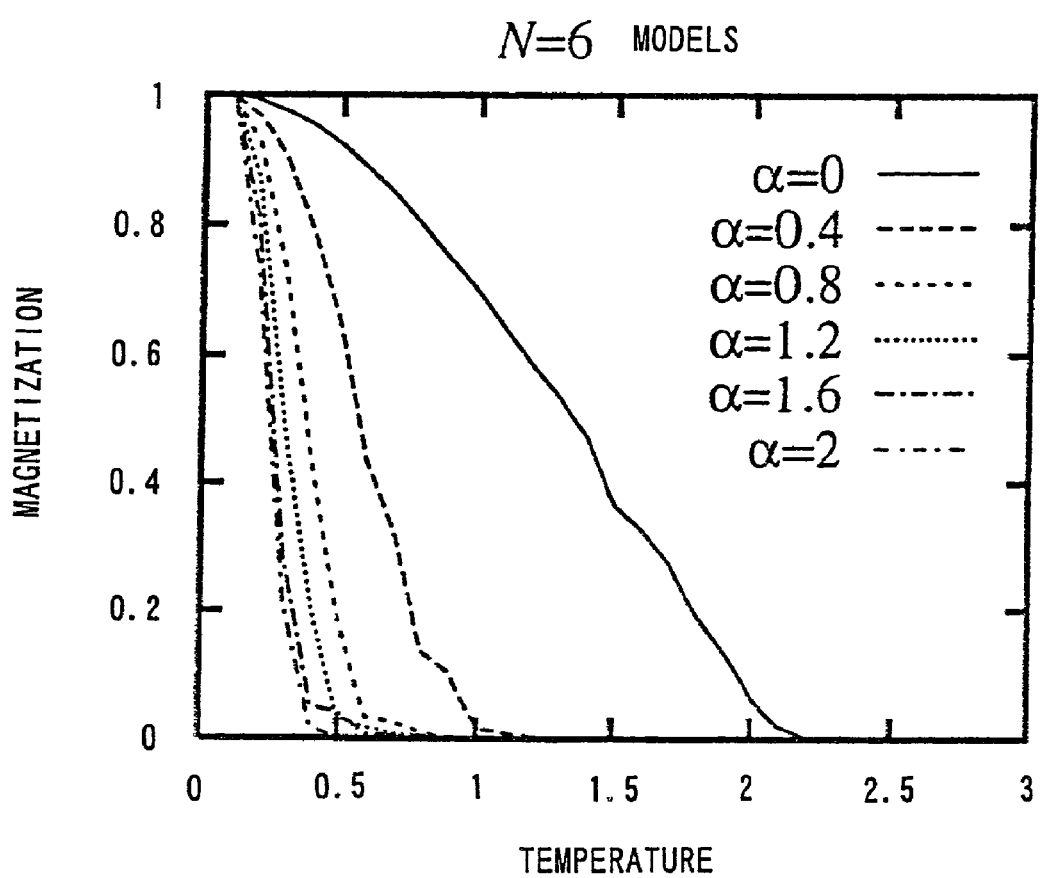
FIG. 7 is a schematic diagram that shows a relation between temperature and magnetization of an N=6 Pott's model in the first embodiment of the invention.
Figure 8:
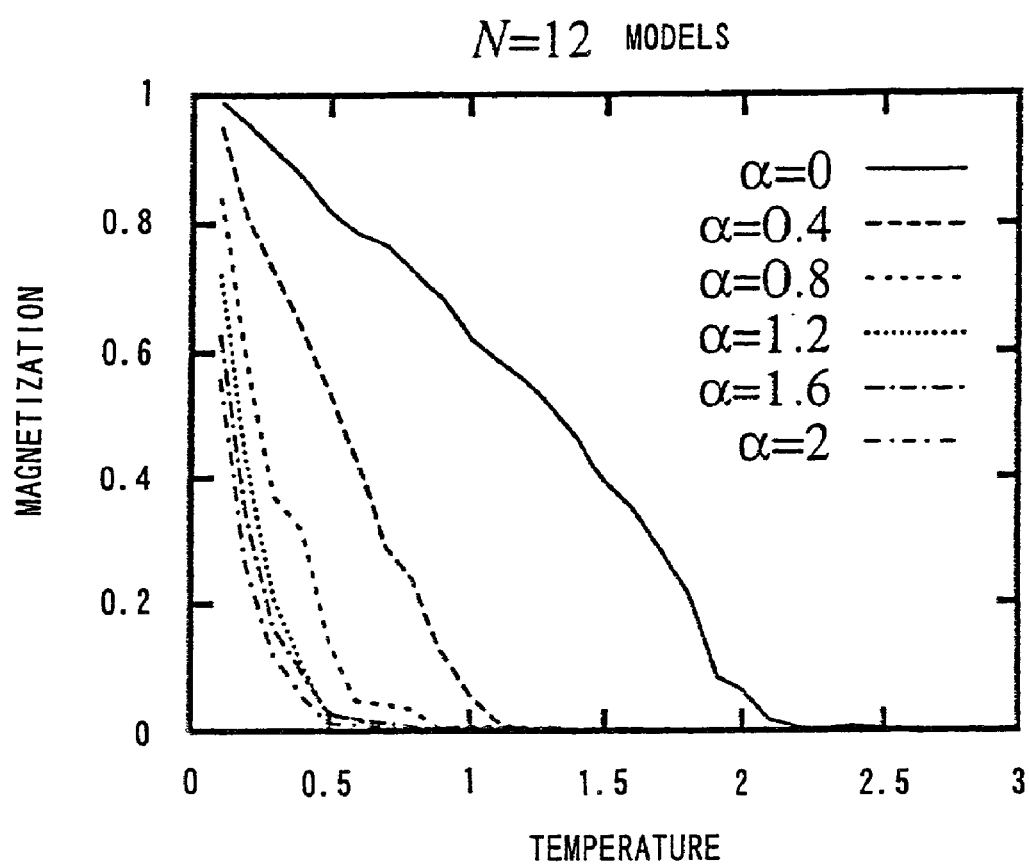
FIG. 8 is a schematic diagram that shows a relation between temperature and magnetization of an N=12 Pott's model in the first embodiment of the invention.
Figure 9:
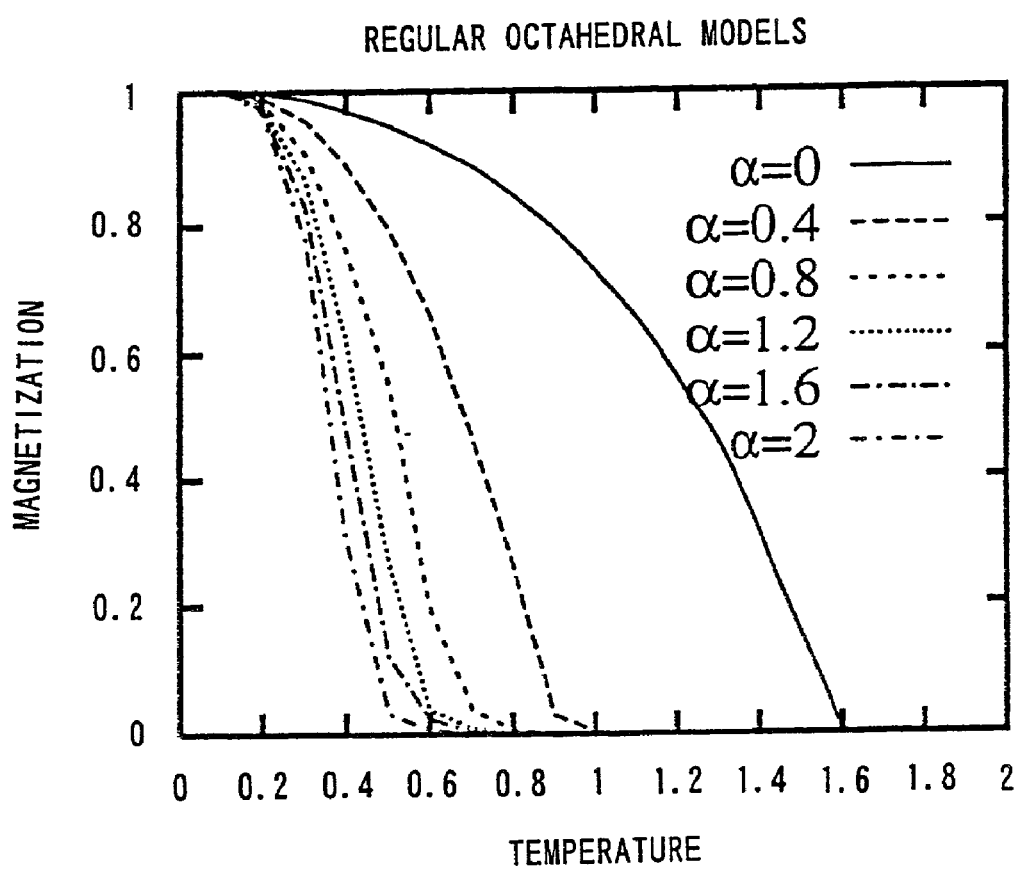
FIG. 9 is a schematic diagram that shows a relation between temperature and magnetization of a regular octahedral model in the first embodiment of the invention.
Figure 10:
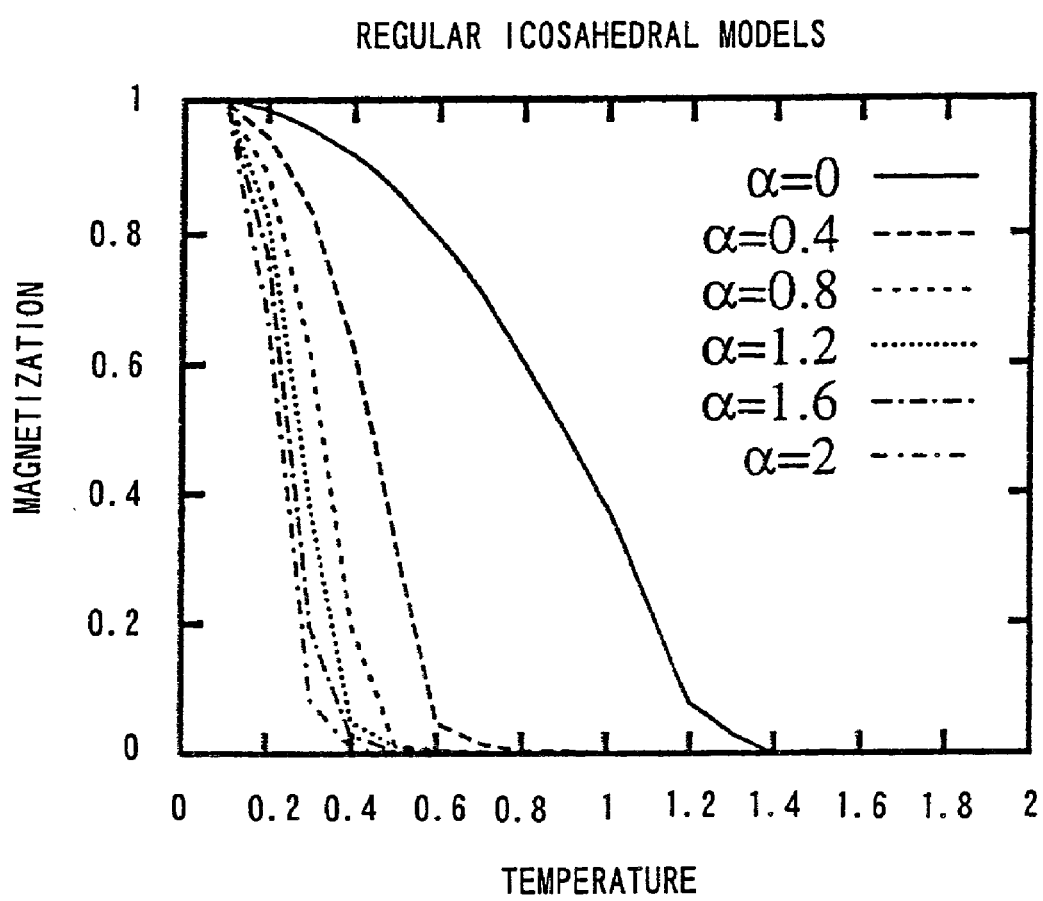
FIG. 10 is a schematic diagram that shows a relation between temperature and magnetization of a regular icosahedral model in the first embodiment of the invention.

A review is made on spontaneous magnetization on a spin system on a fractal-shaped structure, which is the issue in this section. FIG. 6 shows results of N=2 Ising models. FIG. 7 shows results of Pott's models of N=6, and FIG. 8 shows those of N=12. FIG. 9 shows results of regular octahedral models, and FIG. 10 shows results of regular icosahedral models. The parameter α of fractals is changed from 0 to 0.4, 0.8, 1.2, 1.6 and 2. Fractal dimension is near 3 when α=0, then decreases gradually as a increases, and reaches approximately 2.1 under a=2. It will be appreciated that $T_c$ decreases as α increases in any of the models. In case of FIG. 6, changes of $T_c$ from ~4.1 to ~1.0 are observed in response to changes from α=0 to α=2. In case of FIG. 7, changes of $T_c$ from ~2.1 to ~0.4 are observed in response to changes from α=0 to α=2. In case of FIG. 8, changes of $T_c$ from ~2 to ~0.5 are observed in response to changes from α=0 to α=2. In case of FIG. 9, changes of $T_c$ from ~1.6 to ~0.5 are observed in response to changes from α=0 to α=2. In case of FIG. 10, changes of $T_c$ from ~1.3 to ~0.3 are observed in response to changes from α=0 to α=2. In any of these cases, phase transition temperatures as ferromagnetic materials are controlled in sufficiently wide temperature ranges by selecting values of α.

In regions where the fractal dimension is larger than 2.5, significantly sensitive changes in phase transition temperature are recognized. Therefore, by using fractal-coupled structures in these regions, efficient phase transition modulation is ensured.

Figure 11:
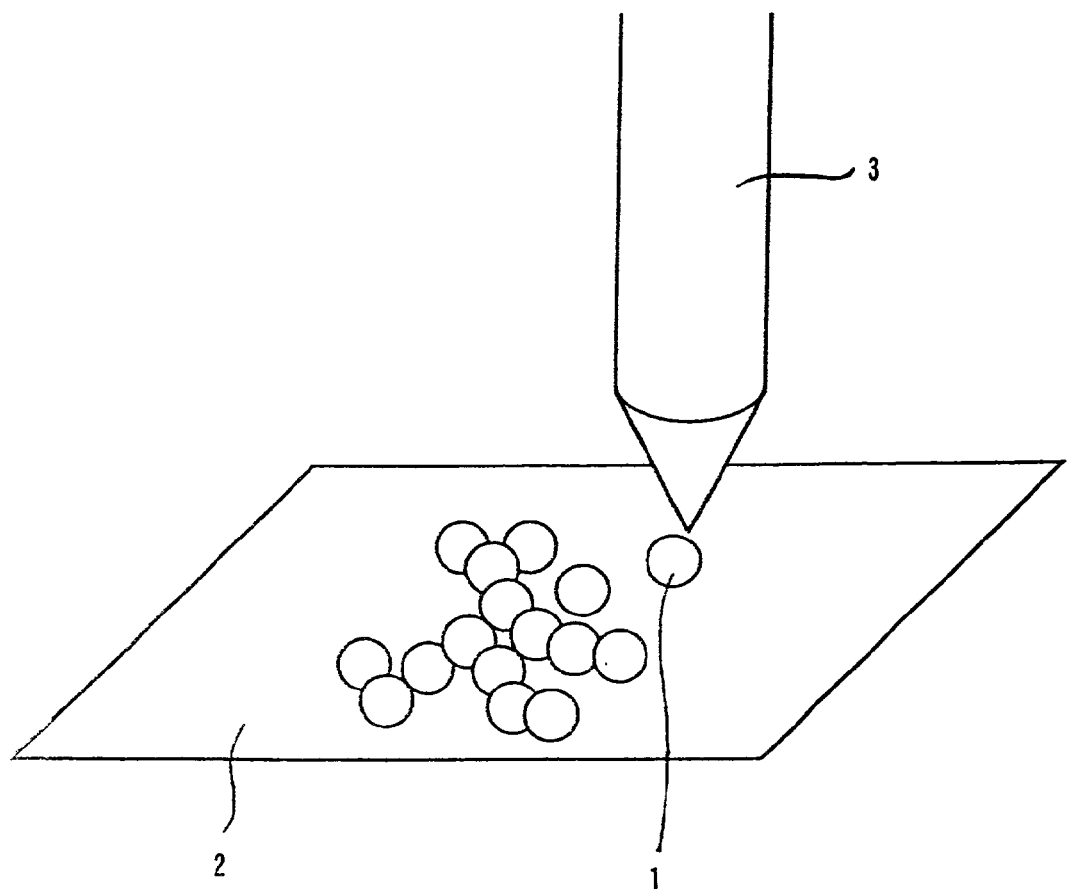
FIG. 11 is a schematic diagram that illustrates a specific example of the first embodiment of the invention.

A specific example of ferromagnetic fractal-coupled structure according to the first embodiment is shown in FIG. 11. That is, as shown in FIG. 11, ferromagnetic material atoms 1 are placed on a substrate 2, and these atoms 1 are re-positioned in a fractal arrangement by using a needle 3 of, for example, a scanning tunneling microscope. When the distance between adjacent atoms 1 is sufficiently small, the atoms move to couple and the structure behaves as a magnetic material. This fractal-coupled structure of atoms 1 is a ferromagnetic fractal-coupled structure.

Next explained is the second embodiment of the invention. Explanation is made here about control of fractal-coupled structures added with magnetic impurities, which realize self-similar strong-coupled quantum chaos.

(1) Formation of a Fractal

Figure 12:
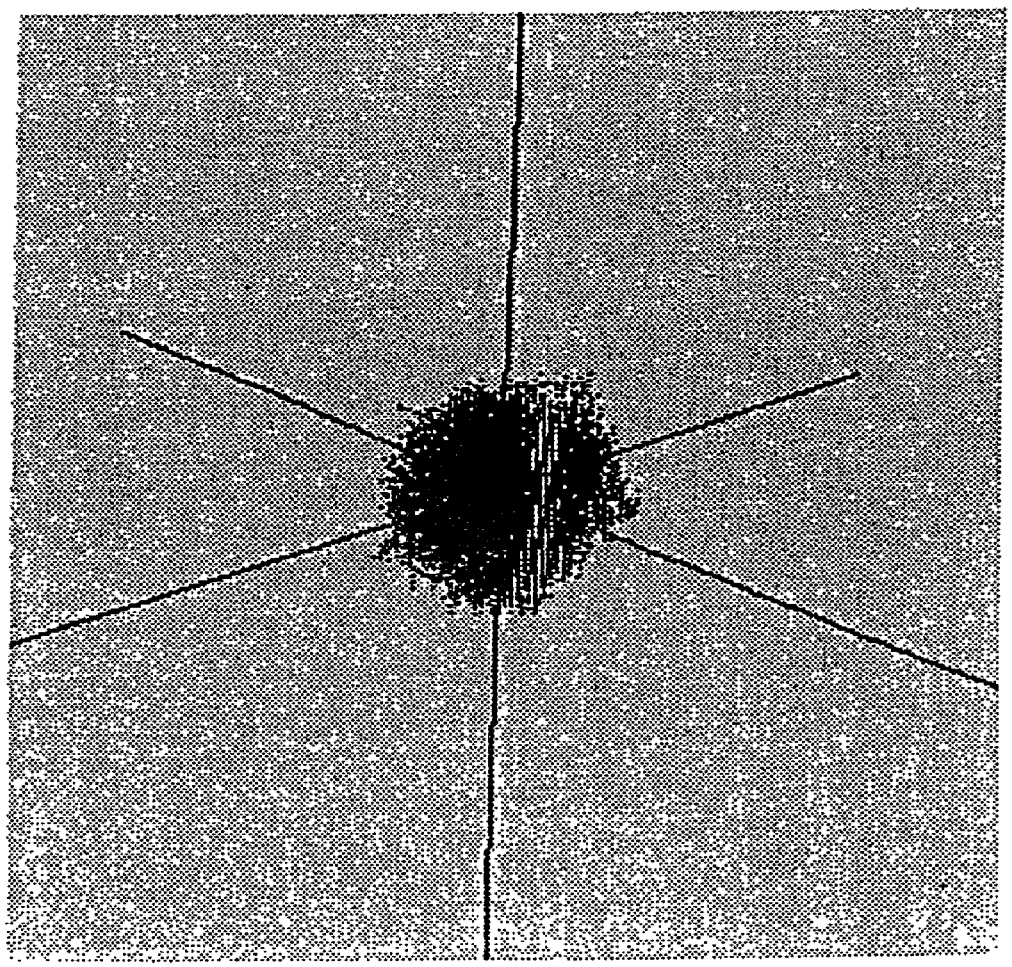
FIG. 12 is a schematic diagram that shows a treelike fractal obtained by fractal growth of n=10000 under $\alpha$=0 in a second embodiment of the invention.
Figure 13:
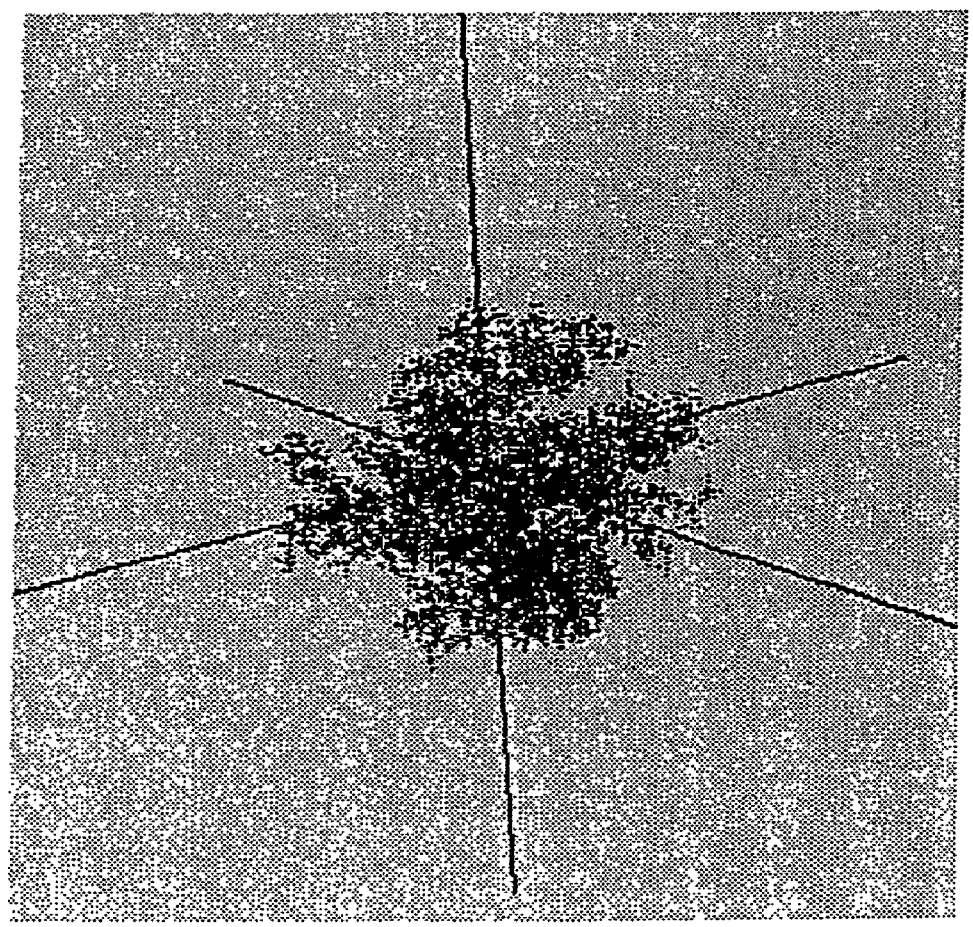
FIG. 13 is a schematic diagram that shows a treelike fractal obtained by fractal growth of n=10000 under $\alpha$=1 in the second embodiment of the invention.
Figure 14:
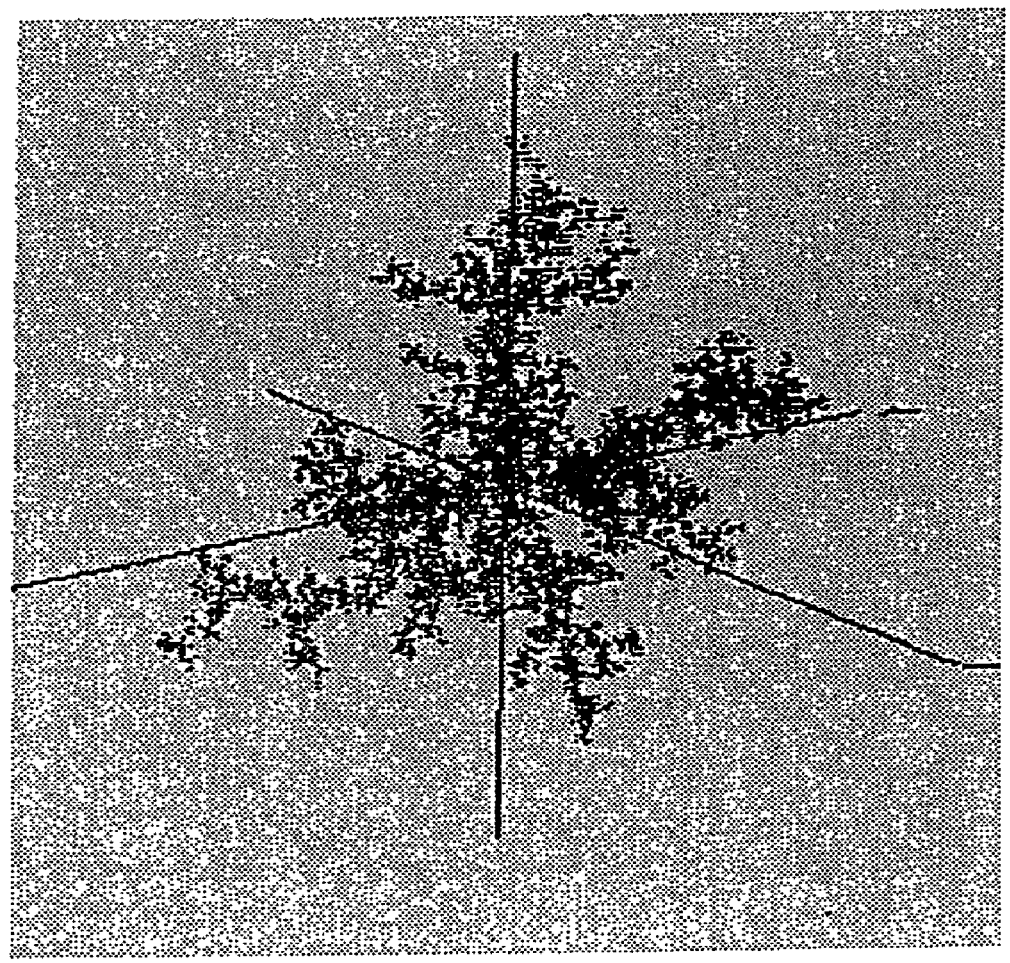
FIG. 14 is a schematic diagram that shows a treelike fractal obtained by fractal growth of n=10000 under $\alpha$=2 in the second embodiment of the invention.

Formation of a fractal follows (1) of the first embodiment. FIGS. 12, 13 and 14 show treelike fractals obtained by n=10000 fractal growth under α=0, 1 and 2. FIG. 12 is that under α=0, FIG. 13 is that under α=1, and FIG. 14 is that under α=2. Fractal dimensions $D_f$ of fractal patterns obtained by numerical simulation with various values of αare collectively shown in FIG. 15.

(2) Electron System on a Fractal

Let a quantum system of one particle be defined on the fractal defined in (1). Assume a lattice site shown below, which is the origin of $T_n$.

$$r_p = (i_{1,p}, i^{2,p}, i_{3,p}) \in T_n \tag{14}$$

where p=1, 2, ..., n+1. An operator $\hat{c}_p^\dagger$ that creates a quantum at a lattice site $r_p \in T_n$. Of course, an anticommutative relation $$\{\hat{c}_p, \hat{c}_q^\dagger\} = \delta_{p,q} \tag{15}$$

is established. Here the Hamiltonian $\hat{H}$ is defined as $$\hat{H}_n = -\sum_{p,q} t_{p,q} \hat{c}_p^\dagger \hat{c}_q \quad (16)$$

Here is employed as the transfer $t_{p,q}$, $$t_{p,q} = \begin{cases} \exp(i\theta_{p,q}) & \text{when } |r_p - r_q| = 1 \\ 0 & \text{otherwise} \end{cases} \quad (17)$$

where $\theta_{p,q} = -\theta_{q,p}$ is a random real number that satisfies $$0 < \theta_{p,q} < 2\pi r \quad (18)$$

The fluctuation range is adjusted by r. In this model, hopping is possible only between nearest-neighbor sites. Along with the hopping, the random phase factor is replaced depending upon the sites. When the phase factor is integrated by a loop making a round of the lattice site, it results in a magnetic flux passing through the loop Locally, therefore, it results in introducing magnetic fields in the random distribution of $0 < \theta_{p,q} < 2\pi r$. This magnetic fields are absolutely random both in strength and in direction, and it is a zero magnetic field in spatial average. Therefore, it never breaks the fractal property of the system. Self-similarity of treelike fractals discussed in this section may be created through an inherently random process, and it exists in the spatial average range. Since the above-mentioned random magnetic fields disappear in terms of spatial average, it does not break the self-similarity of the treelike fractal. Degeneracy in density of states due to self-similarity is not broken by random magnetic fields. In case of r=0, it results in a model where no random magnetic field exists.

When $\epsilon_m$ denotes the eigenenergy of the Hamiltonian $$\hat{H}$$

and |m> denotes the eigenvector, $$\hat{H}|m\rangle = \varepsilon_m |m\rangle \quad (19)$$

where m=0, 1, 2, . . . , n.

First, n+1 quantum levels $\epsilon_m$ are quantized such that spacing between nearest-neighbor levels becomes 1 in average. That is, $$\omega_j = \epsilon_j - \epsilon_{j-1} \quad (20)$$

However, when j=1, 2, . . . , n, by using $$\bar{\omega} = \frac{1}{n} \sum_{j=1}^{n} \omega_j \quad (21)$$

it is converted into new levels $$\epsilon_0 = 0 \quad (22)$$

$$\varepsilon_m = \frac{1}{\bar{\omega}} \sum_{j=1}^{n} \omega_j = \sum_{j=1}^{m} \Omega_j \quad (23)$$

Here, $$\Omega_j = \frac{\omega_j}{\bar{\omega}} \quad (24)$$

The density of states of the system is defined by $$\rho(\varepsilon) = \frac{1}{n+1} \sum_{m=1}^{n+1} \delta(\varepsilon - \varepsilon_m) \quad (25)$$

the staircase function $$\lambda(\varepsilon) = \int_{-\infty}^{\varepsilon} d\eta \rho(\eta) \quad (26)$$

is calculated. The staircase function obtained is converted by "unfolding" such that the density of states becomes constant in average. By using quantum levels obtained in this manner, nearest-neighbor level spacing distribution P(s) and $\Delta_3$ statistics of Dyson and Metha are calculated as quantum level statistics. As taught in a literature ((37) L. E. Reichl, The transition to chaos: in conservative classical systems: quantum manifestations (Springer, NewYork, 1992); (38) F. Haake, Quantum Signatures of chaos, (Springer-Verlag, 1991)), by using these statistics, it can be detected whether quantum chaos has been generated or not. It is also known that a quantum chaotic system is sensitive to perturbation from outside similarly to the classical chaotic system, and analysis of quantum chaos is important as a polestar of designs of non-linear materials.

In case of an integrable system, nearest-neighbor level spacing distribution P(s) and $\Delta_3$ statistics of Dyson and Metha are those of Poisson Distribution $$P_p(s) = e^{-s} \quad (27)$$

$$\Delta_3(n) = \frac{n}{15} \quad (28)$$

Figure 16:
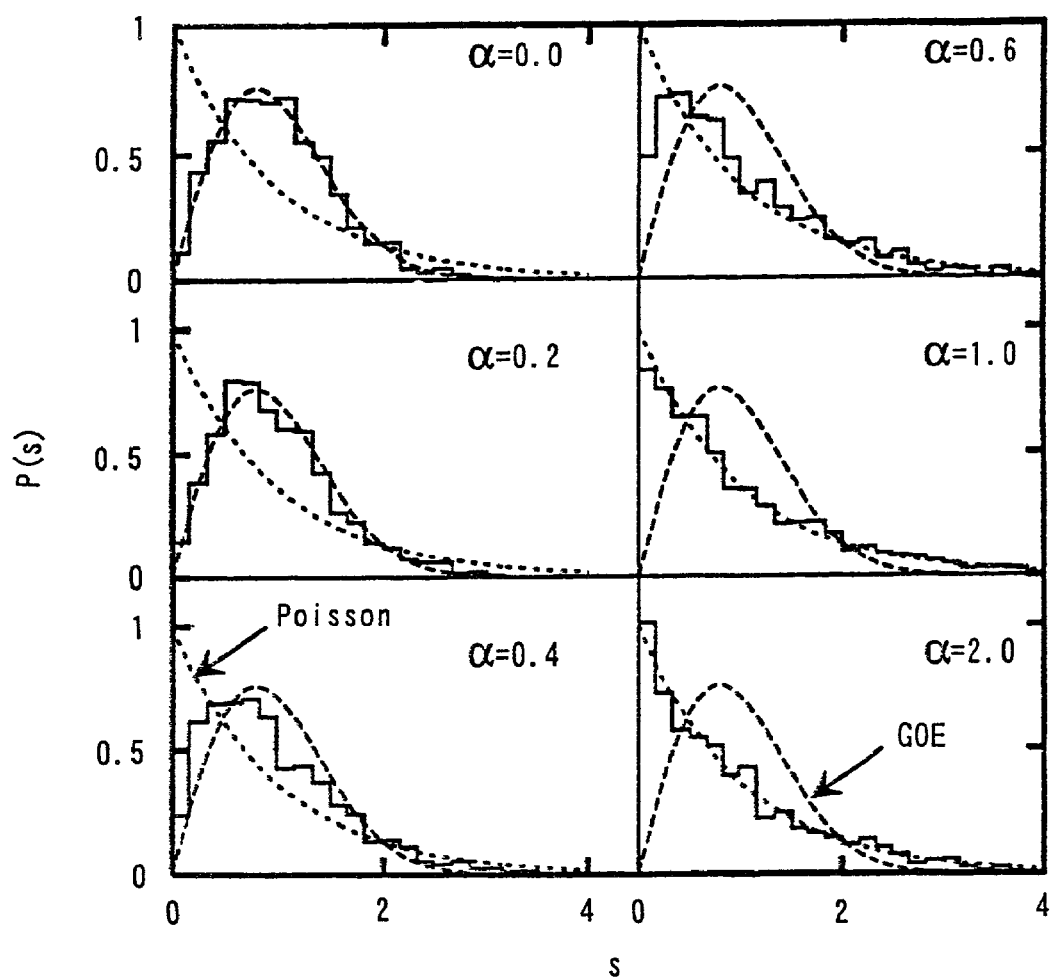
FIG. 16 is a schematic diagram that shows a quantum level statistic under r=0 in the second embodiment of the invention.
Figure 17:
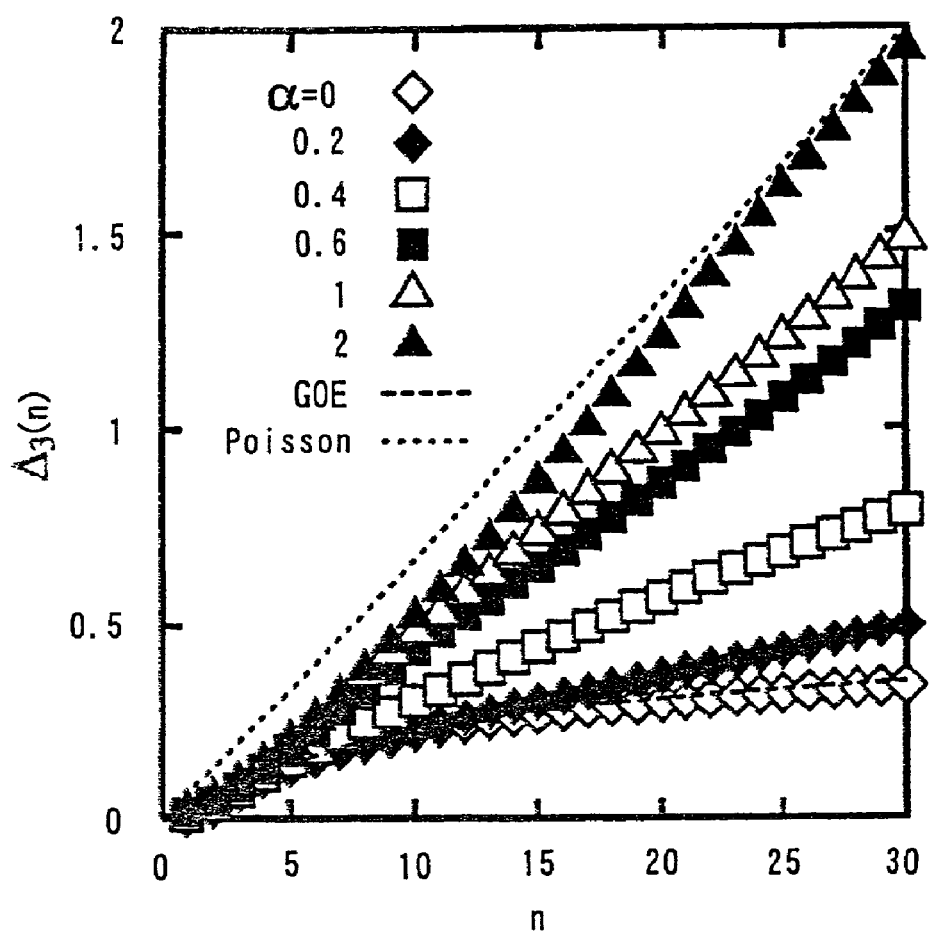
FIG. 17 is a schematic diagram that shows a quantum level statistic under r=0 in the second embodiment of the invention.

In a system obeying GOE distribution that is the weakest quantum chaos, they are $$P_{GOE}(s) = \frac{\pi s}{2} e^{-\pi s^2/4} \quad (29)$$

$$\Delta_3(n) = \frac{1}{\pi^2} \left[ \log(2\pi n) + \gamma - \frac{\pi^2}{8} - \frac{5}{4} \right] + O(s^{-1}) \quad (30)$$

where γ is the Euler's constant. FIGS. 16 and 17 show quantum level statistics under r=0. As α becomes smaller, transition occurs from Poisson distribution to GEO distribution. In a treelike fractal with no magnetic impurities, quantum chaos that appears under small values of α is characterized by GOE distribution. Regions with s~0 of P(s) should be remarked. In integrable systems, P(s)~1. On the other hand, in case of GOE distribution, P(s)~α, and in regions of s~0, probability of existence of level spacing is proportional to the energy difference s.

Figure 18:
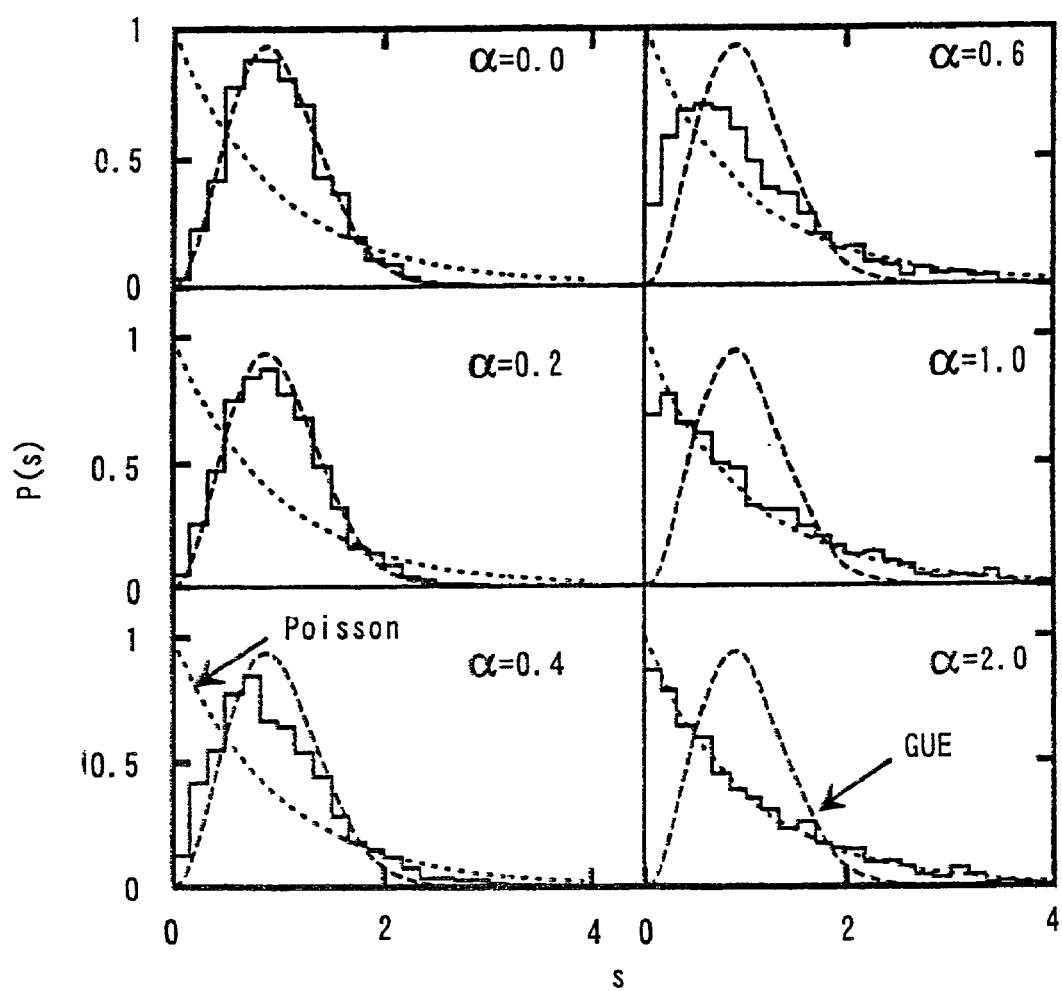
FIG. 18 is a schematic diagram that shows a quantum level statistic under r=1 in the second embodiment of the invention.
Figure 19:
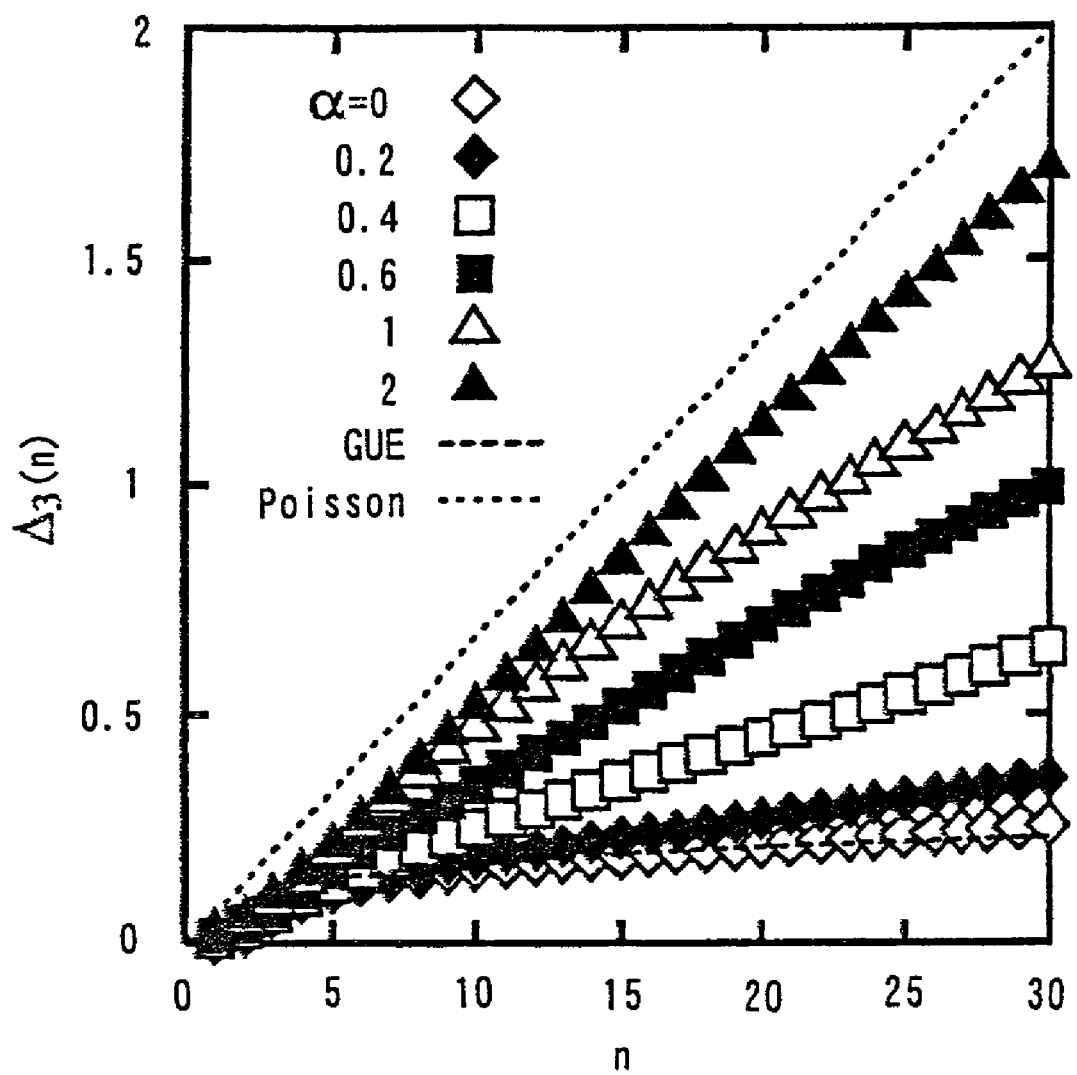
FIG. 19 is a schematic diagram that shows a quantum level statistic under r=1 in the second embodiment of the invention.

On the other hand, statistics under r=1 with magnetic impurities in the second embodiment are shown in FIGS. 18 and 19. As a decreases, transition occurs from Poisson distribution to GUE (Gaussian unitary ensemble). In this GUE distribution, $$P_{GUE}(s) = \frac{32s^2}{\pi^2} e^{-4s^2/\pi} \tag{31}$$

$$\Delta_3(n) = \frac{1}{2\pi^2}\left[\log(2\pi n) + \gamma - \frac{5}{4}\right] + O(s^{-1}) \tag{32}$$

That is, in regions of s~0, $P(S) \alpha s^2$, values of P(s) are suppressed more strongly. Therefore, by introducing magnetic impurities, it has been found that stronger quantum chaos characterized by GUE distribution appears.

Through such strong quantum chaos, Anderson transition can be controlled in fractal-coupled structures added with magnetic impurities.

Examples of fractal-coupled structures added with magnetic impurities include fractal-coupled structure made of Cu and doped with Mn as the magnetic impurity, fractal-coupled structures made of GaAs and doped with Mn as the magnetic impurity, and so on. Magnetic impurities to be doped are, in general, those with an impurity level not overlapping the bulk quantum level.

Next explained is the third embodiment of the invention. As the third embodiment, control of Mott-Hubbard transition by fractal dimensions of fractal-coupled structures is explained.

Fractal-coupled structures are made by creating fractals as explained below, and defining electron systems thereon.

(1) Formation of a Fractal

Formation of a fractal follows (1) of the first embodiment. FIGS. 12, 13 and 14 show treelike fractals obtained by n=10000 fractal growth under α=0, 1 and 2. FIG. 12 is that under α=0, FIG. 13 is that under α=1, and FIG. 14 is that under α=2. Fractal dimensions $D_f$ of fractal patterns obtained by numerical simulation with various values of a are collectively shown in FIG. 15.

(2) Electron System on a Fractal

An electron system is defined on the fractal defined in (1). Assume a lattice site shown below, which is the origin of $T_n$.

$$r_p = (i_{1,p}, i_{2,p}, i_{3,p}) \in T_n \tag{33}$$

where p=1, 2, . . . , n+1. An operator $\hat{c}_{p,q}^\dagger$ that creates an electron of a spin σ at a lattice site $r_p \in T_n$. Of course, an anticommutative relation $$\left\{\hat{c}_{p,\sigma}, \hat{c}_{q,\rho}^\dagger\right\} = \delta_{p,q}\delta_{\sigma,\rho}, \tag{34}$$

is established. Here the single-band Hubbard Hamiltonian $$\hat{H}$$

is defined as $$\hat{H} = t\sum_{i,j,\sigma} \lambda_{i,j} \hat{c}_{i,\sigma}^\dagger \hat{c}_{j,\sigma} + U\sum_j \hat{n}_{j,\uparrow}\hat{n}_{j,\downarrow} \tag{35}$$

Let electrons be movable only among nearest-neighbor sites, and the following is employed as $\lambda_{p,q}$.

$$\lambda_{p,q}\begin{cases} 1 \text{ when } |r_p - r_q| = 1 \\ 0 \text{ otherwise} \end{cases} \tag{36}$$

Additionally, the spin σ electron density operator of the j-th site, $$\hat{n}_{j,\sigma} = \hat{c}_{j,\sigma}^\dagger \hat{c}_{j,\sigma}$$

, and their sum, $$\hat{n}_j = \sum_\sigma \hat{n}_{j,\sigma}$$

are defined.

To define the temperature Green function, the Taisho quasi-Hamiltonian $$\hat{K} = \hat{H} - \mu\hat{N}$$

is introduced, where $$\hat{N} = \sum_j \hat{n}_j.$$

In the half filled taken here, chemical potential is μ=U/2. The half-filled grand-canonical Hamiltonian can be expressed as $$\hat{H} = t\sum_{i,j,\sigma} \lambda_{j,i} \hat{t}_{j,i,\sigma} + U/2\sum_i (\hat{u}_i - 1) \tag{37}$$

Operators $\hat{t}_{j,i,\sigma}, \hat{j}_{j,i,\sigma} \hat{u}_i$ and $\hat{d}_{i,\sigma}$ are previously defined as $$\hat{t}_{j,i,\sigma} = \hat{c}^\dagger_{j,\sigma}\hat{c}_{i,\sigma} + \hat{c}^\dagger_{i,\sigma}\hat{c}_{j,\sigma} \quad (38)$$

$$\hat{j}_{j,i,\sigma} = \hat{c}^\dagger_{j,q}\hat{c}_{i,\sigma} - \hat{c}^\dagger_{i,\sigma}\hat{c}_{j,\sigma} \quad (39)$$

$$\hat{u}_i = \hat{c}^\dagger_{i,\uparrow}\hat{c}_{i,\uparrow}\hat{c}^\dagger_{i,\downarrow}\hat{c}_{i,\downarrow} + \hat{c}_{i,\uparrow}\hat{c}^\dagger_{i,\uparrow}\hat{c}_{i,\downarrow}\hat{c}^\dagger_{i,\downarrow} \quad (40)$$

$$\hat{d}_{i,\sigma} = \hat{c}^\dagger_{i,\sigma}\hat{c}_{i,\sigma} - \hat{c}_{i,\sigma}\hat{c}^\dagger_{i,\sigma} \quad (41)$$

If the temperature Green function is defined for operators $\hat{A}$ and $\hat{B}$ given, taking $\tau$ as imaginary time, it is as follows.

$$\langle \hat{A}; \hat{B} \rangle = -\int_0^\beta d\tau \langle T_\tau \hat{A}(\tau)\hat{B}\rangle e^{i\omega_n \tau} \quad (42)$$

The on-site Green function $$G_{j,\sigma}(i\omega_n) = \langle \hat{c}_{j,\sigma}; \hat{c}^\dagger_{j,\sigma}\rangle \quad (43)$$

is especially important because analytic continuation $i\omega_n \to \omega + i\delta$ for a small $\delta$ results in $$-\sum_{\sigma=\uparrow,\downarrow} \mathrm{Im} G_{j,\sigma}(\omega + i\delta) \quad (44)$$

as the local density of states of the site j and $$-\frac{1}{n+1}\sum_{j,\sigma} \mathrm{Im} G_{j,\sigma}(\omega + i\delta) \quad (45)$$

as the density of states of the system. For later numerical calculation of densities of states, $\delta = 0.0001$ will be used.

Imaginary time development of the system is obtained by the Heisenberg equation $$\frac{d}{d\tau}\hat{A}(\tau) = [\hat{K}, \hat{A}] \quad (46)$$

As the equation of motion of the on-site Green function, $$i\omega_n \langle \hat{c}_{j,\sigma}; \hat{c}^\dagger_{j,\sigma}\rangle = 1 + t\sum_{p,j}\lambda_{p,j}\langle \hat{c}_{p,\sigma}; \hat{c}^\dagger_{j,\sigma}\rangle + \frac{U}{2}\langle \hat{d}_{j,-\sigma}\hat{c}_{j,\sigma}; \hat{c}^\dagger_{j,\sigma}\rangle \quad (47)$$

is obtained. Then, the approximation shown below is introduced, following Gros ((39) C. Gros, Phys. Rev. B50, 7295(1994)). If the site p is the nearest-neighbor site of the site j, the resolution $$\langle \hat{c}_{p,\sigma}; \hat{c}^\dagger_{j,\sigma}\rangle \to t\langle \hat{c}_{p,\sigma}; \hat{c}^\dagger_{p,\sigma}\rangle\langle \hat{c}_{j,\sigma}; \hat{c}^\dagger_{j,\sigma}\rangle \quad (48)$$

is introduced as the approximation. This is said to be exact in case of infinite-dimensional Bethe lattices, but in our case, it is only within approximation. Under the approximation, the following equation is obtained.

$$(i\omega_n - t^2 \Gamma_{j,\sigma})G_{j,\sigma} = 1 + \frac{U}{2}\langle \hat{d}_{j,-\sigma}\hat{c}_{j,\sigma}; \hat{c}^\dagger_{j,\sigma}\rangle \quad (49)$$

where $$\Gamma_{j,\sigma} = \sum_p \lambda_{p,j} G_{p,\sigma} \quad (50)$$

was introduced. To solve the equation obtained, $$\langle \hat{d}_{j,-\sigma}\hat{c}_{j,\sigma}; \hat{c}^\dagger_{j,\sigma}\rangle$$

has to be analyzed. In case of a half-filled electron density, this equation of motion is $$i\omega_n \langle \hat{d}_{j,-\sigma}\hat{c}_{j,\sigma}; \hat{c}^\dagger_{j,\sigma}\rangle = \frac{U}{2}G_{j,\sigma} - 2t\sum_p \lambda_{p,j}\langle \hat{j}_{p,j,-\sigma}\hat{c}_{j,\sigma}; \hat{c}^\dagger_{j,\sigma}\rangle + t\sum_p \lambda_{p,j}\langle \hat{d}_{j,-\sigma}\hat{c}_{p,\sigma}; \hat{c}^\dagger_{j,\sigma}\rangle \quad (51)$$

Here again, with reference to the Gros logic, approximation is introduced. It is the following translation.

$$\langle \hat{j}_{p,j,-\sigma} \hat{c}_{j,\sigma} ; \hat{c}_{j,\sigma}^\dagger \rangle \rightarrow -tG_{p,-\sigma} \langle \hat{d}_{j,-\sigma} \hat{c}_{j,\sigma} ; \hat{c}_{j,\sigma}^\dagger \rangle \quad (52)$$

$$\langle \hat{d}_{j,-\sigma} \hat{c}_{j,\sigma} ; \hat{c}_{j,\sigma}^\dagger \rangle \rightarrow tG_{p,\sigma} \langle \hat{d}_{j,-\sigma} \hat{c}_{j,\sigma} ; \hat{c}_{j,\sigma}^\dagger \rangle \quad (53)$$

By executing this translation, the following closed equation was obtained.

$$(i\omega_n - t^2 \Gamma_{j,\sigma}) G_{j,\sigma} = 1 + \frac{(U/2)^2}{i\omega_n - t^2 \Gamma_{j,\sigma} - 2t^2 \Gamma_{j,-\sigma}} G_{j,\sigma} \quad (54)$$

assuming that it is under no dependency on spin. That is, assuming $G_{j,\uparrow} = G_{j,\downarrow}$, the following calculation is executed.

Figure 20:
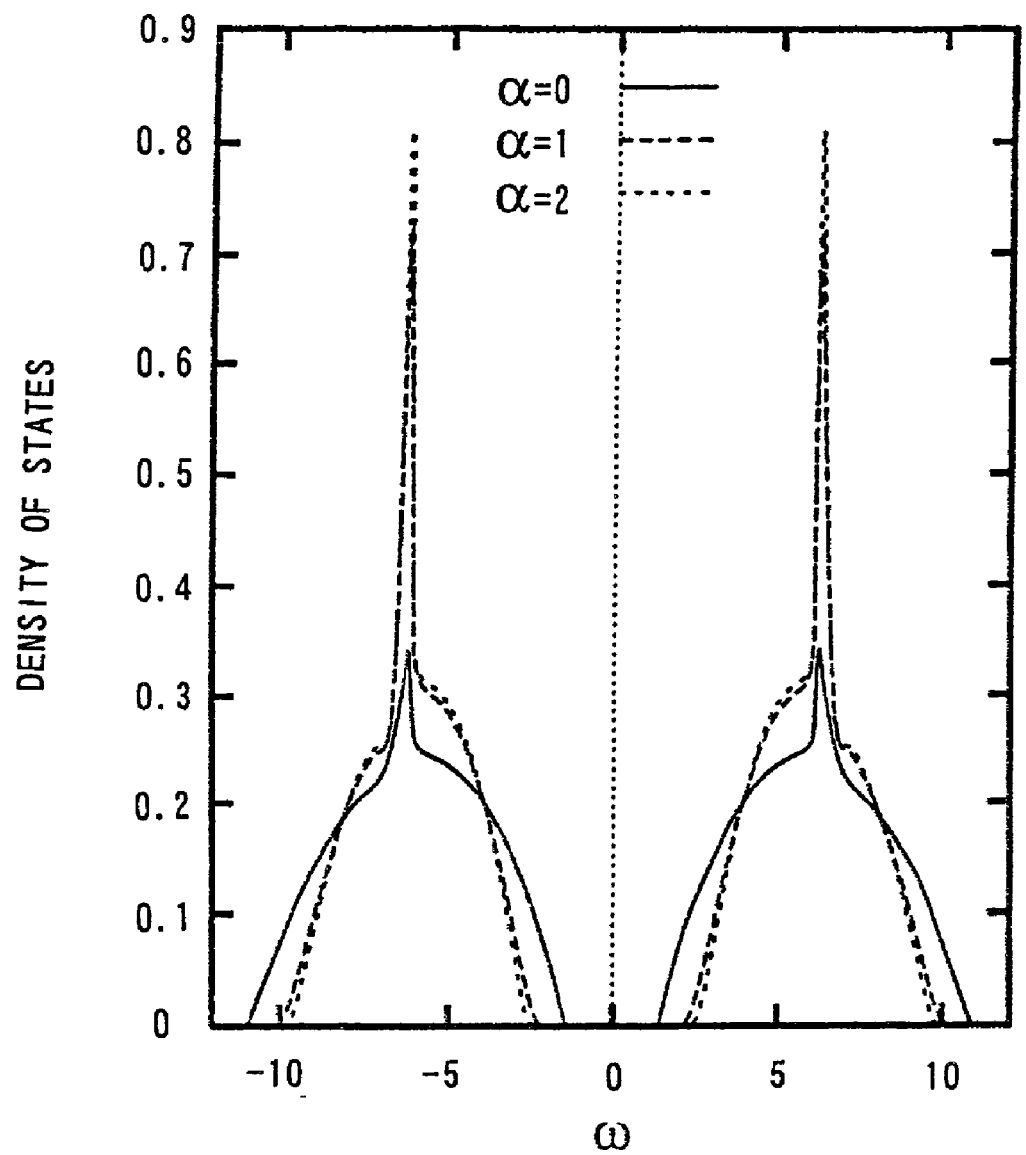
FIG. 20 is a schematic diagram that shows changes in density of states obtained by a numerical calculation in a third embodiment of the invention.
Figure 21:
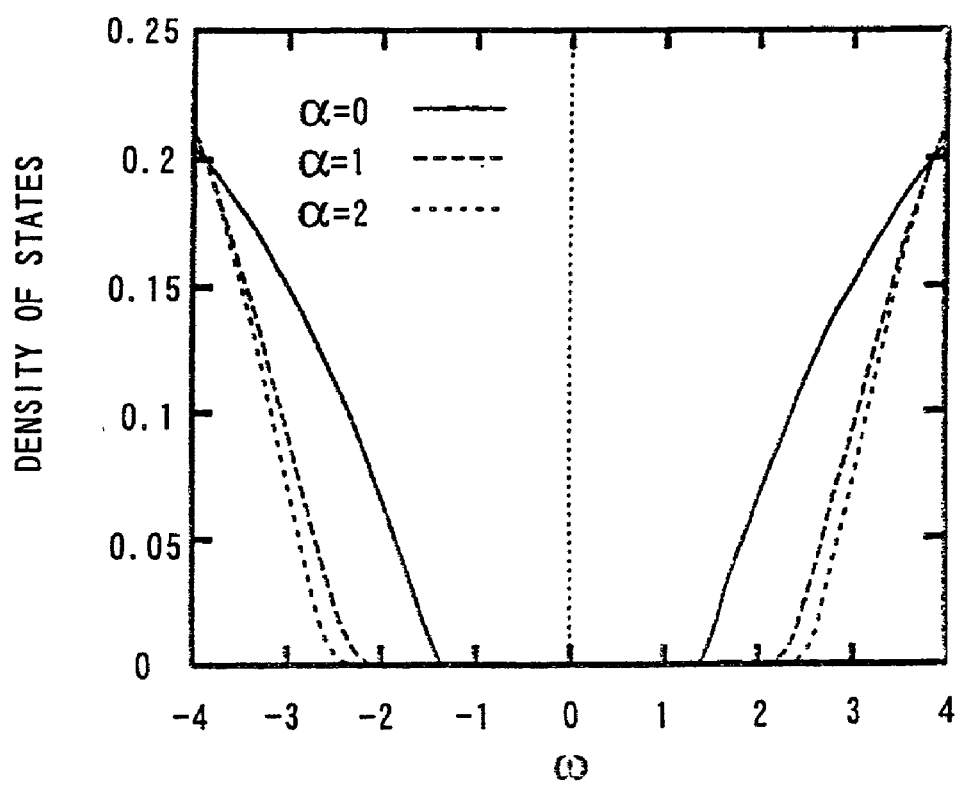
FIG. 21 is a schematic diagram that shows, in an enlarged scale, a region proximate to the Mott-Hubbard gap shown in FIG. 20.
Figure 22:
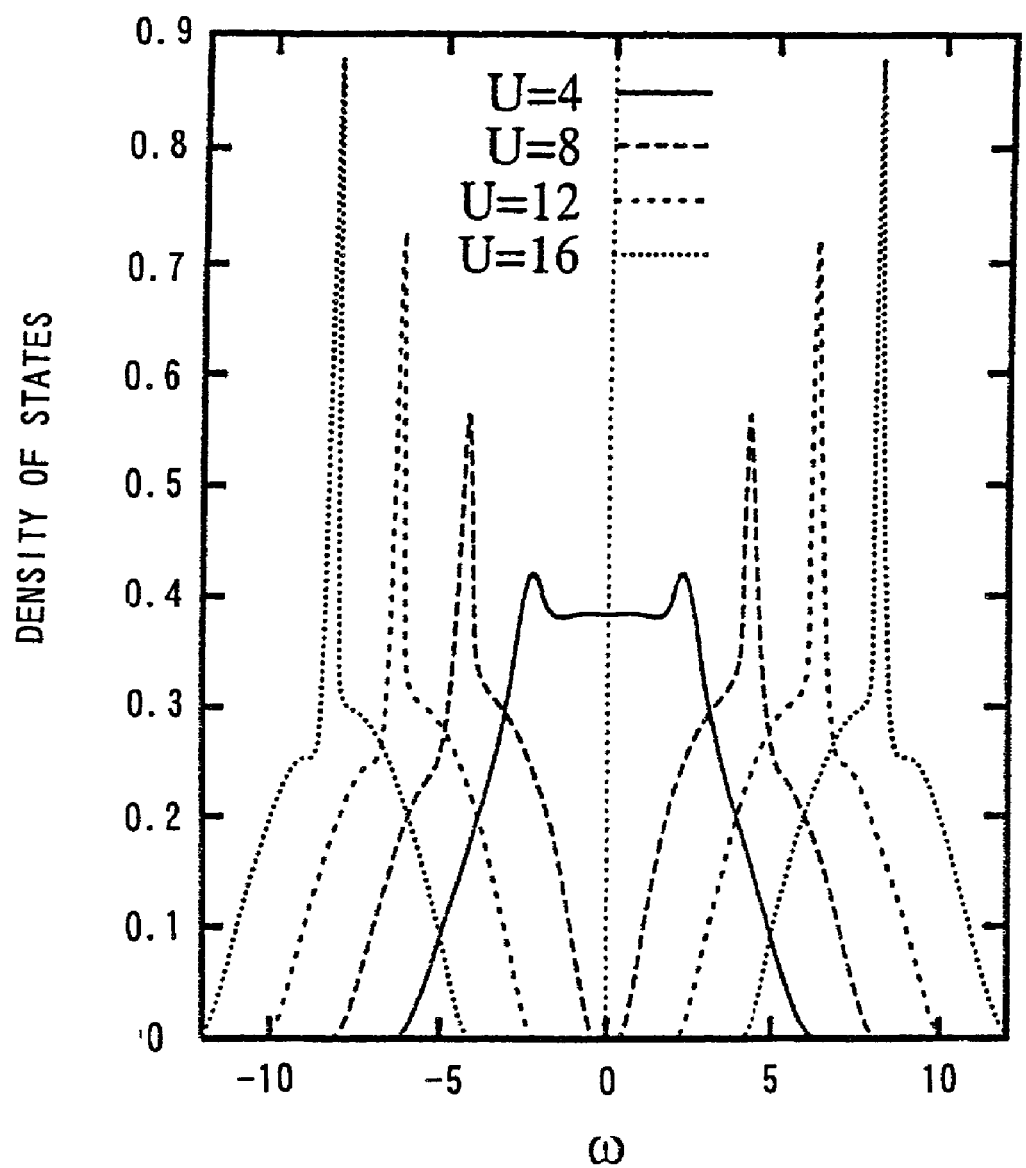
FIG. 22 is a schematic diagram that shows changes in density of states under t=1, n=10001 and α=1 all fixed, while changing U as 4, 8, 12 and 16, in a third embodiment of the invention.

FIG. 20 shows densities of states obtained by numerical calculation. n=10000 sites were used as a treelike fractal. In this calculation, t=1 and U=12 were used under α=0, 1, 2. The band are separated into right and left sides, and the left side is the lower Hubbard band whereas the right side is the upper Hubbard band. Only the lower Hubbard band is filled with electrons, and the region between right left sides with zero density of states is the Mott-Hubbard gap. FIG. 21 shows the region near the Mott-Hubbard gap in an enlarged scale. It is appreciated that, as α increases (as the fractal dimension decreases), the Mott-Hubbard gap increases, and insulation is enhanced. Regarding Mott transition caused by changes of U, densities of states are shown. FIG. 22 shows those by changes of U=4, 8, 12, 16 under t=1 and α=1. Peaks of densities of states in the center of the subband are those by degeneracy of states caused y fractal properties.

Figure 23:
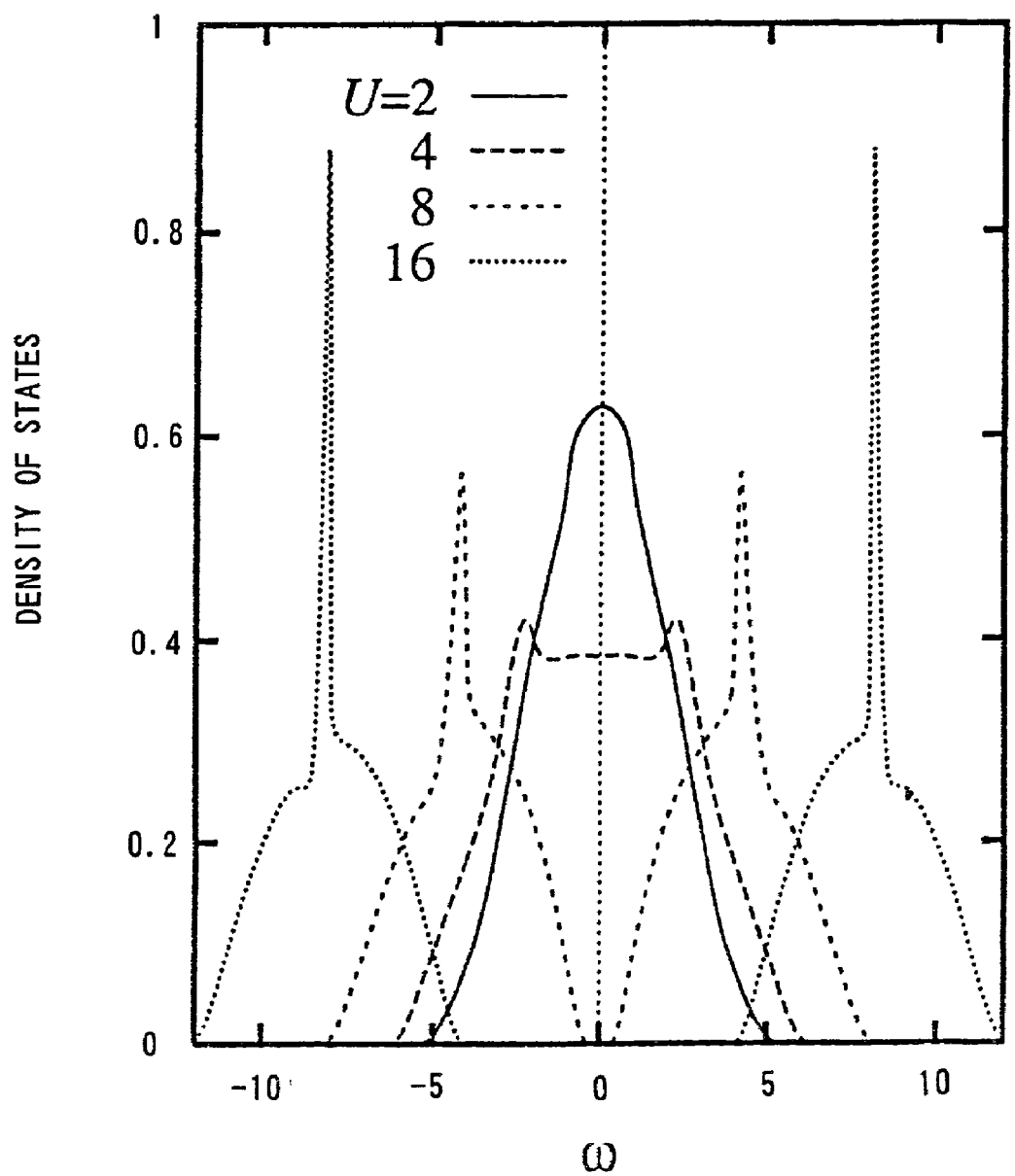
FIG. 23 is a schematic diagram that shows changes in density of states under t=1, n=10001 and a=1 all fixed, while changing U as 2, 4, 8, 16 and 16, in the third embodiment of the invention.
Figure 24:
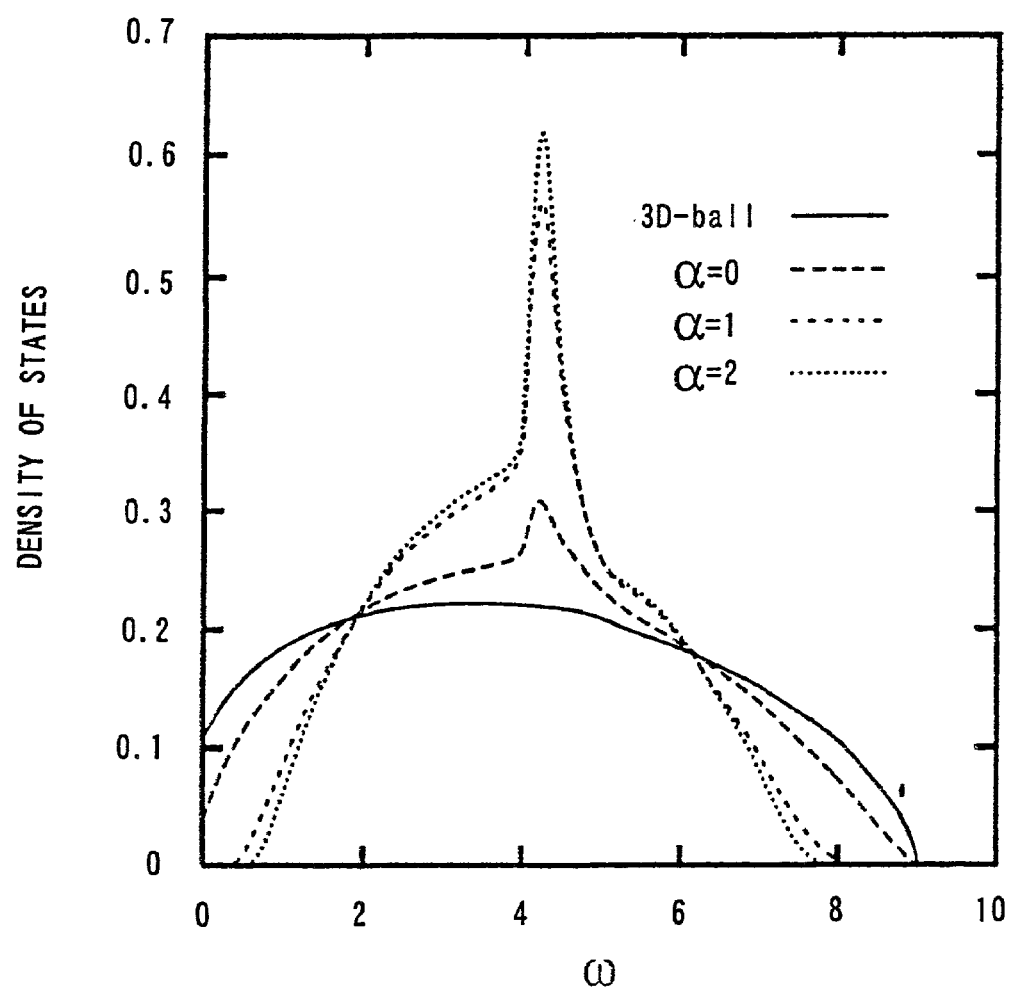
FIG. 24 is a schematic diagram that shows changes in density of states under t=1, n=10001 and U=8 all fixed, while changing a as 0, 1 and 2 in the third embodiment of the invention.
Figure 25:
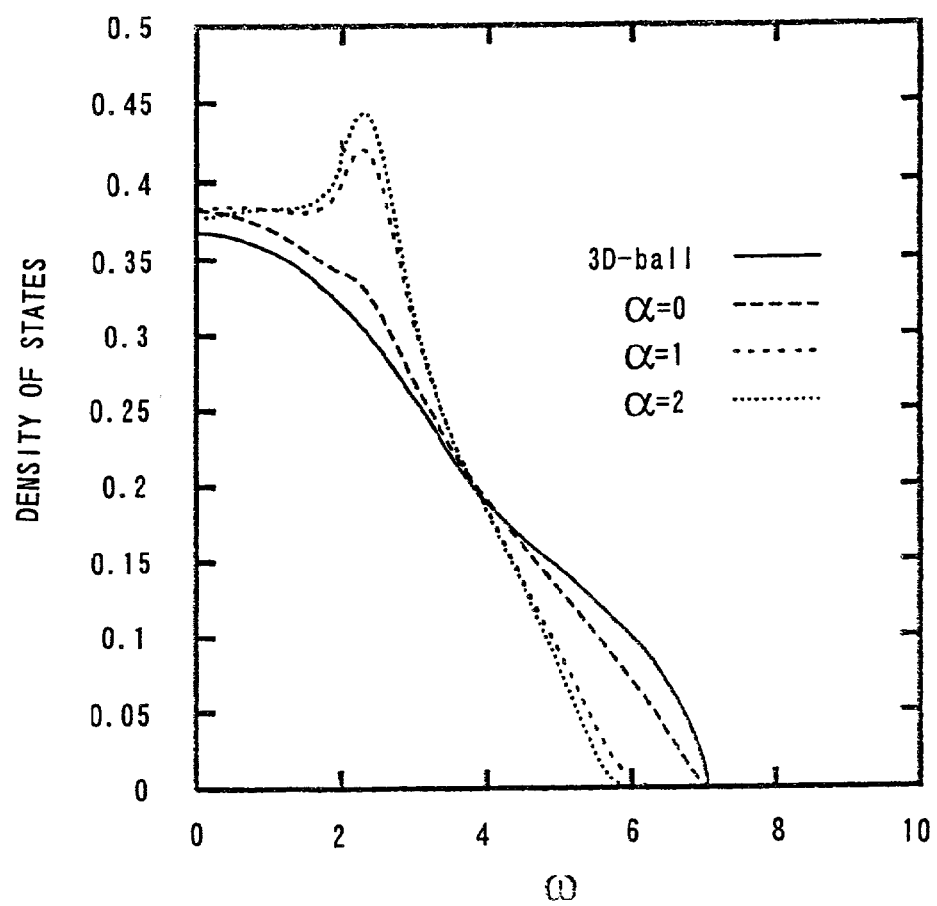
FIG. 25 is a schematic diagram that shows changes in density of states under t=1, n=10001 and U=4 all fixed, while changing α as 0, 1 and 2 in the third embodiment of the invention.
Figure 26:
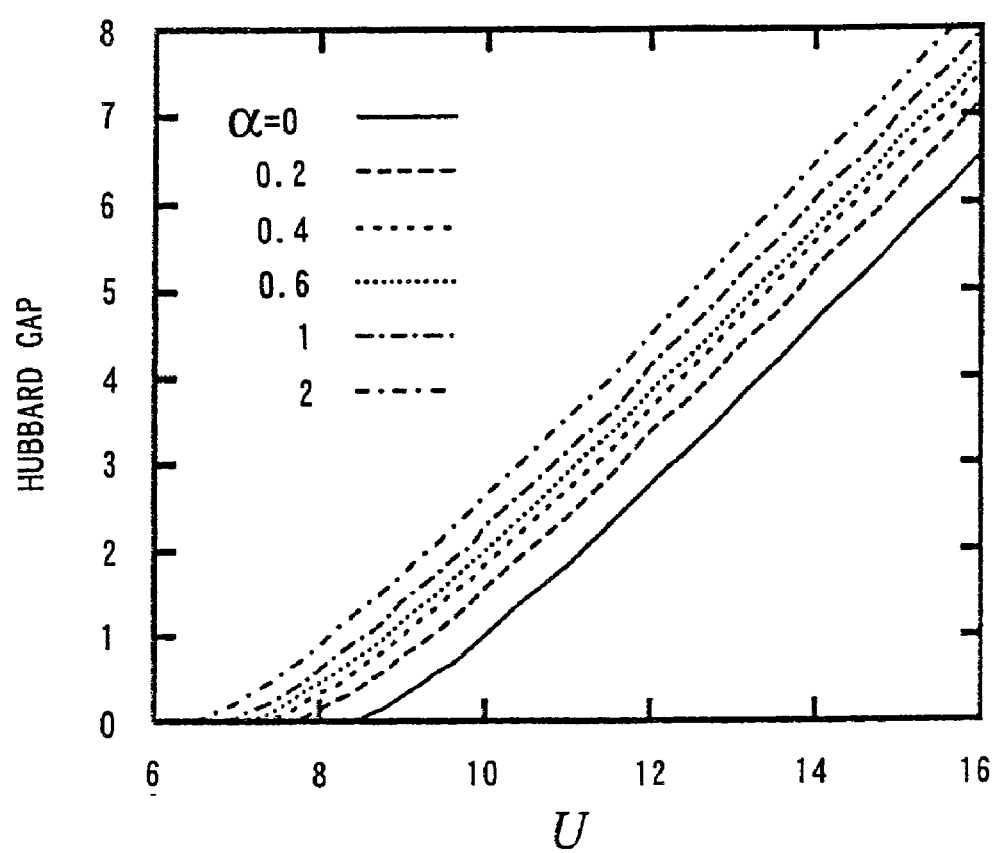
FIG. 26 is a schematic diagram that shows changes in Hubbard gap under t=1 and n=10001 both fixed, while changing U continuously under α=0, 0.2, 0.4, 0.6, 1 and 2 in the third embodiment of the invention.
Figure 27:
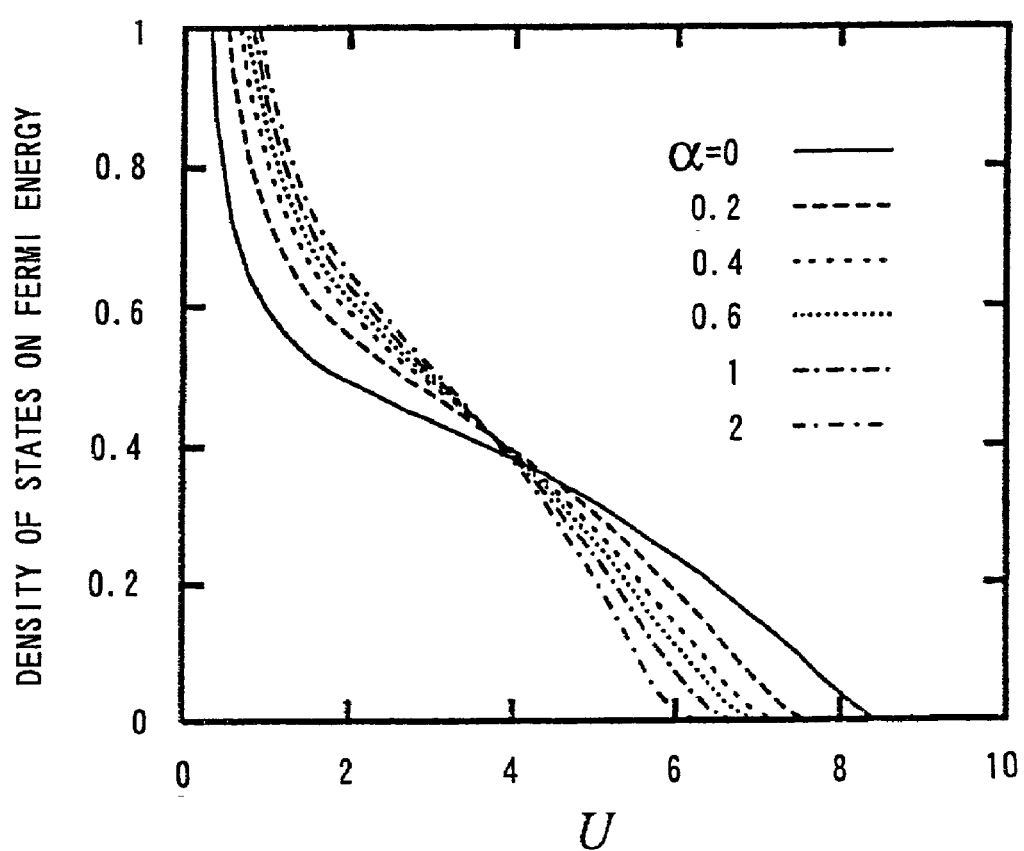
FIG. 27 is a schematic diagram that shows changes in density of states on Fermi energy under t=1 and n=10001 both fixed, while changing U continuously under α=0, 0.2, 0.4, 0.6, 1 and 2 in the third embodiment of the invention.

FIG. 23 shows those by changes of U=2, 4, 8, 16 under fixed α=1, as examples of densities of states obtained by numerical calculations under fixed t=1 and n=10000. FIG. 24 shows results with a three-dimensional ball (3D-ball) of 10001 sites under U=8 and α=0, 1, 2. FIG. 25 shows Hubbard gaps plotted by continuously changing U under α=0, 0.2, 0.4, 0.6, 1.2. FIG. 26 shows densities of states in terms of Fermi energy, plotted by continuously changing U here again under α=0, 0.2, 0.4, 0.6, 1.2. In critical interaction of electrons $U_c$ where Mott transition occurs, it is appreciated that Hubbard gaps appear and densities of states in terms of Fermi energy disappear. Then, the critical value $U_c$ is controlled by α.

Examples of fractal-coupled structured adjusted to half-filled electron densities include fractal-coupled structures made of monatomic metals, fractal-coupled structures made of $V_2O_3$, and so forth.

Figure 28A:
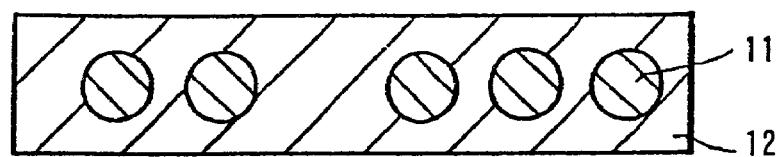
FIGS. 28A and 28B are schematic diagrams that show a specific example of the third embodiment of the invention.
Figure 28B:
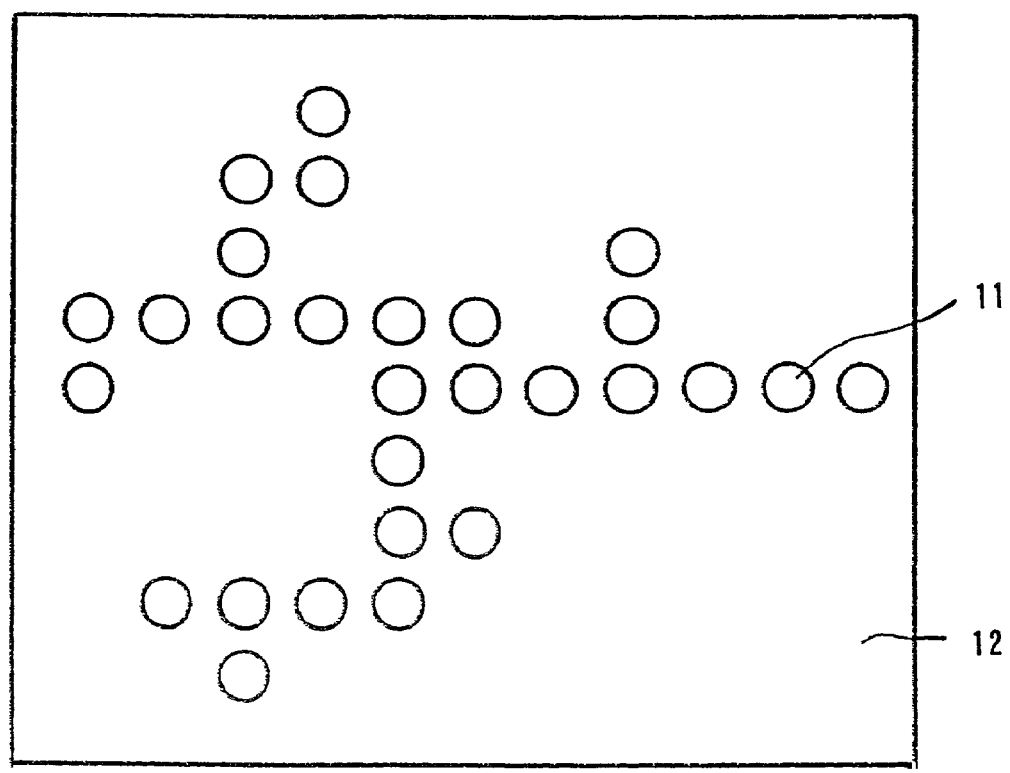

Fractal-coupled structures adjusted in half-filled electron densities may be made of quantum dot arrays by heterojunction of compound semiconductors. One of such examples is shown in FIGS. 28A and 28B. FIG. 28A is a cross-sectional view and FIG. 28B is a plan view illustrating placement of the quantum dot array.

As shown in FIGS. 28A and 28B, this fractal-coupled structure contains a fractal arrangement of GaAs quantum dots 11 of i-type GaAs, which are confined by i-type AlGaAs 12. The quantum dot array of GaAs quantum dots 11 is adapted to allow tunneling of electrons between nearest-neighbor quantum dots.

Heretofore, specific examples according to embodiments of the invention have been explained. However, the invention is not limited to those embodiments, but should be interpreted to involve various modifications based on the technical concept of the invention.

As described above, according to the invention, by controlling fractal dimensions of fractal-coupled structures overall or locally, phase transition can be controlled without the need for heating. Then, such phase transition can be used in information storage, or more generally, information processing.

What is claimed is:

1. A ferromagnetic fractal-coupled structure comprising a magnetic material configured to have self-similarity, wherein ferromagnetic phase transition temperature is determined by selection of fractal dimension that characterizes the self-similarity of said magnetic material.

2. The ferromagnetic fractal-coupled structure according to claim 1 wherein said fractal dimension of said magnetic material is not smaller than 2.5.

3. A fractal-coupled structure configured to have self-similarity and having a half-filled electron density, wherein interaction of electrons in an electron system can be increased larger than the band with, and Mott transition exists, said Mott transition being controlled by fractal dimension of the system.

* * * * *

UNITED STATES PATENT AND TRADEMARK OFFICE
CERTIFICATE OF CORRECTION

| | | |
|---|---|---|
| PATENT NO. | : 7,061,007 B1 | Page 1 of 1 |
| APPLICATION NO. | : 09/868360 | |
| DATED | : June 13, 2006 | |
| INVENTOR(S) | : Ryuichi Ugajin, Yoshihiko Kuroki and Masakazu Ukita | |

It is certified that error appears in the above-identified patent and that said Letters Patent is hereby corrected as shown below:

ON THE TITLE PAGE

Addition of:
Item should read
--(30) Foreign Application Priority Data

Oct. 20, 1999  (JP)     1999-298810--

Signed and Sealed this

Nineteenth Day of February, 2008

JON W. DUDAS
*Director of the United States Patent and Trademark Office*